United States Patent
Kim et al.

(10) Patent No.: US 11,844,235 B2
(45) Date of Patent: Dec. 12, 2023

(54) ORGANIC LIGHT EMITTING DISPLAY DEVICE COMPRISING A REFLECTIVE MEMBER HAVING FIRST OPENING FORMED IN DISPLAY AREA AND SECOND OPENING FORMED IN PERIPHERAL AREA

(71) Applicant: Samsung Display Co., LTD., Yongin-si (KR)

(72) Inventors: Joonyoup Kim, Seoul (KR); Youngwoo Song, Suwon-si (KR); Jinkoo Chung, Suwon-si (KR); Junho Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/430,154

(22) Filed: Feb. 10, 2017

(65) Prior Publication Data

US 2017/0244069 A1    Aug. 24, 2017

(30) Foreign Application Priority Data

Feb. 23, 2016    (KR) .......................... 10-2016-0021400

(51) Int. Cl.
*H01L 51/56*    (2006.01)
*H10K 50/856*    (2023.01)
(Continued)

(52) U.S. Cl.
CPC .......... *H10K 50/856* (2023.02); *H05B 33/24* (2013.01); *H10K 50/841* (2023.02);
(Continued)

(58) Field of Classification Search
CPC ............. H01L 27/3272; H01L 27/3282; H01L 27/3295; H01L 51/5271; H01L 51/5281; H10K 50/856
See application file for complete search history.

(56) References Cited

U.S. PATENT DOCUMENTS 7,190,116 B2 *  3/2007  Kobayashi .......... H01L 27/3246
                                                      257/72
8,253,322 B2 *  8/2012  Lee ..................... H01L 51/5284
                                                      313/506
(Continued)

FOREIGN PATENT DOCUMENTS

EP              0940796         9/1999
KR       10-2009-0099744 A      9/2009
(Continued)

OTHER PUBLICATIONS

EP Search Report corresponding to European Patent Application No. 17155064.3, dated Jul. 18, 2017, 9 pages.

(Continued)

*Primary Examiner* — Anh D Mai
(74) *Attorney, Agent, or Firm* — Innovation Counsel LLP

(57) ABSTRACT

An organic light emitting display device includes a substrate comprising a display area and a peripheral area and a first reflective member positioned in both the display area and the peripheral area. The first reflective member includes a first opening formed in a light-emitting region of the display area and a second opening formed in the peripheral area. The second reflective portion has openings having the same shape as openings formed in the first reflective portion. Thus, a reflectivity of the first reflective portion may be substantially the same as a reflectivity of the second reflective portion, and the first reflective portion and the second reflective portion may be perceived as an integral reflective member. Therefore, a bezel-less mirror organic light emitting display device may be manufactured.

10 Claims, 35 Drawing Sheets

(51) Int. Cl.
*H05B 33/24* (2006.01)
*H10K 50/84* (2023.01)
*H10K 50/844* (2023.01)
*H10K 50/86* (2023.01)
*H10K 50/842* (2023.01)
*H10K 59/122* (2023.01)
*H10K 59/126* (2023.01)
*H10K 59/131* (2023.01)
*H10K 71/00* (2023.01)

(52) U.S. Cl.
CPC ....... *H10K 50/844* (2023.02); *H10K 50/8423* (2023.02); *H10K 50/865* (2023.02); *H10K 59/122* (2023.02); *H10K 59/126* (2023.02); *H10K 59/131* (2023.02); *H10K 71/00* (2023.02)

(56) References Cited

U.S. PATENT DOCUMENTS

| | | | | |
|---|---|---|---|---|
| 8,525,406 | B2* | 9/2013 | Kim | H01L 51/524 |
| | | | | 313/512 |
| 9,093,660 | B2 | 7/2015 | Yang et al. | |
| 9,136,315 | B1 | 9/2015 | Kim et al. | |
| 9,324,771 | B2 | 4/2016 | Yim et al. | |
| 9,882,169 | B2* | 1/2018 | Kim | H01L 51/56 |
| 9,893,137 | B2* | 2/2018 | Kim | H01L 27/3272 |
| 9,991,474 | B2* | 6/2018 | Kim | H01L 27/322 |
| 10,163,992 | B2* | 12/2018 | Chung | H01L 27/3258 |
| 10,268,294 | B2* | 4/2019 | Seo | G06F 3/0412 |
| 10,371,986 | B2* | 8/2019 | Lee | G02F 1/133553 |
| 2008/0084366 | A1* | 4/2008 | Saito | G06F 3/0421 |
| | | | | 345/76 |
| 2009/0009070 | A1 | 1/2009 | Chan et al. | |
| 2009/0027773 | A1* | 1/2009 | Kawakami | G02B 5/3058 |
| | | | | 359/485.05 |
| 2010/0007268 | A1* | 1/2010 | Kim | H01L 27/3227 |
| | | | | 313/504 |
| 2010/0148192 | A1* | 6/2010 | Jung | H01L 51/5284 |
| | | | | 257/59 |
| 2012/0299472 | A1* | 11/2012 | Chung | H01L 51/5271 |
| | | | | 313/504 |
| 2013/0099660 | A1 | 4/2013 | Shen et al. | |
| 2014/0160411 | A1* | 6/2014 | Yim | G02F 1/133553 |
| | | | | 349/113 |
| 2014/0312321 | A1 | 10/2014 | Yoo et al. | |
| 2014/0367646 | A1* | 12/2014 | Kim | H01L 27/3246 |
| | | | | 257/40 |
| 2015/0002953 | A1 | 1/2015 | Yoon | |
| 2015/0034918 | A1* | 2/2015 | Yim | H01L 27/323 |
| | | | | 257/40 |
| 2015/0205418 | A1* | 7/2015 | Nam | G06F 3/044 |
| | | | | 345/174 |
| 2015/0311477 | A1* | 10/2015 | Cho | H01L 27/3244 |
| | | | | 257/40 |
| 2016/0043349 | A1 | 2/2016 | Park et al. | |
| 2016/0240818 | A1* | 8/2016 | Chung | H01L 27/3276 |
| 2016/0291219 | A1* | 10/2016 | Lee | H01L 51/5271 |
| 2017/0069808 | A1* | 3/2017 | Kim | H01L 27/1248 |
| 2017/0214003 | A1* | 7/2017 | Lee | H01L 51/5271 |
| 2018/0026087 | A1* | 1/2018 | Lee | H01L 27/3272 |
| | | | | 257/40 |

FOREIGN PATENT DOCUMENTS

| | | |
|---|---|---|
| KR | 10-2014-0019990 A | 2/2014 |
| KR | 10-2014-0073216 A | 6/2014 |
| KR | 10-2015-0016031 A | 2/2015 |
| WO | WO-2012121372 A1 * 9/2012 ....... G02F 1/133512 |

OTHER PUBLICATIONS

European Office Action corresponding to Application No. 17155064.3 dated Dec. 17, 2020, 6 pages.

* cited by examiner

FIG. 1
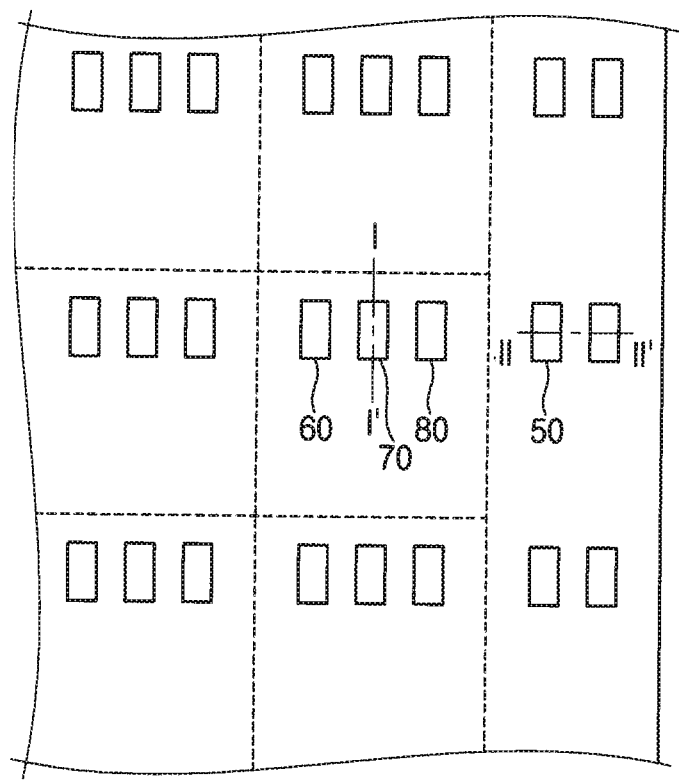
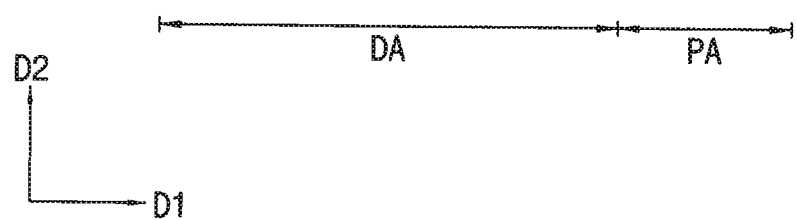

FIG. 9
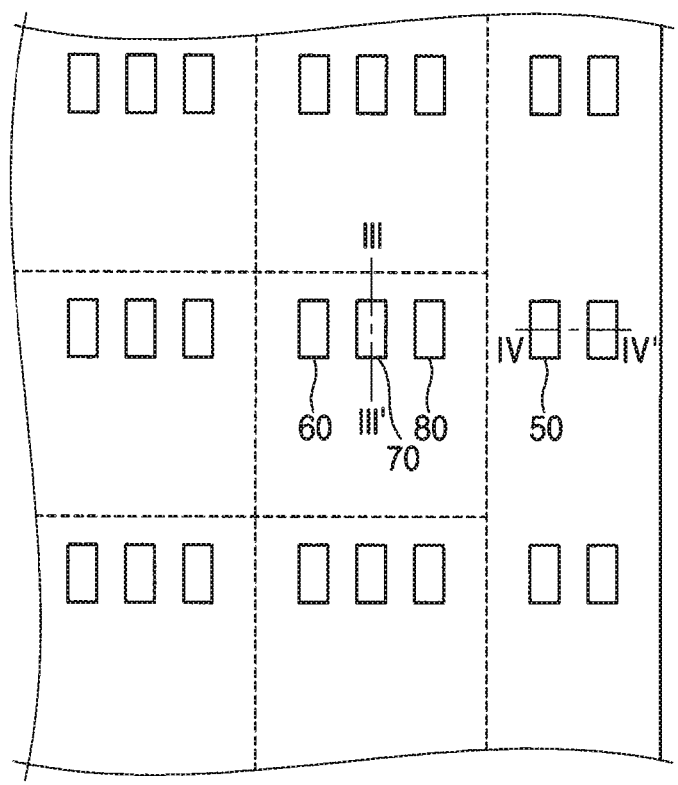
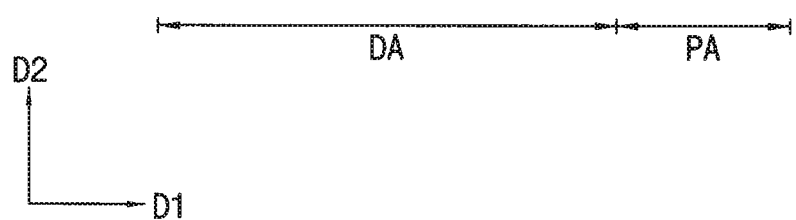

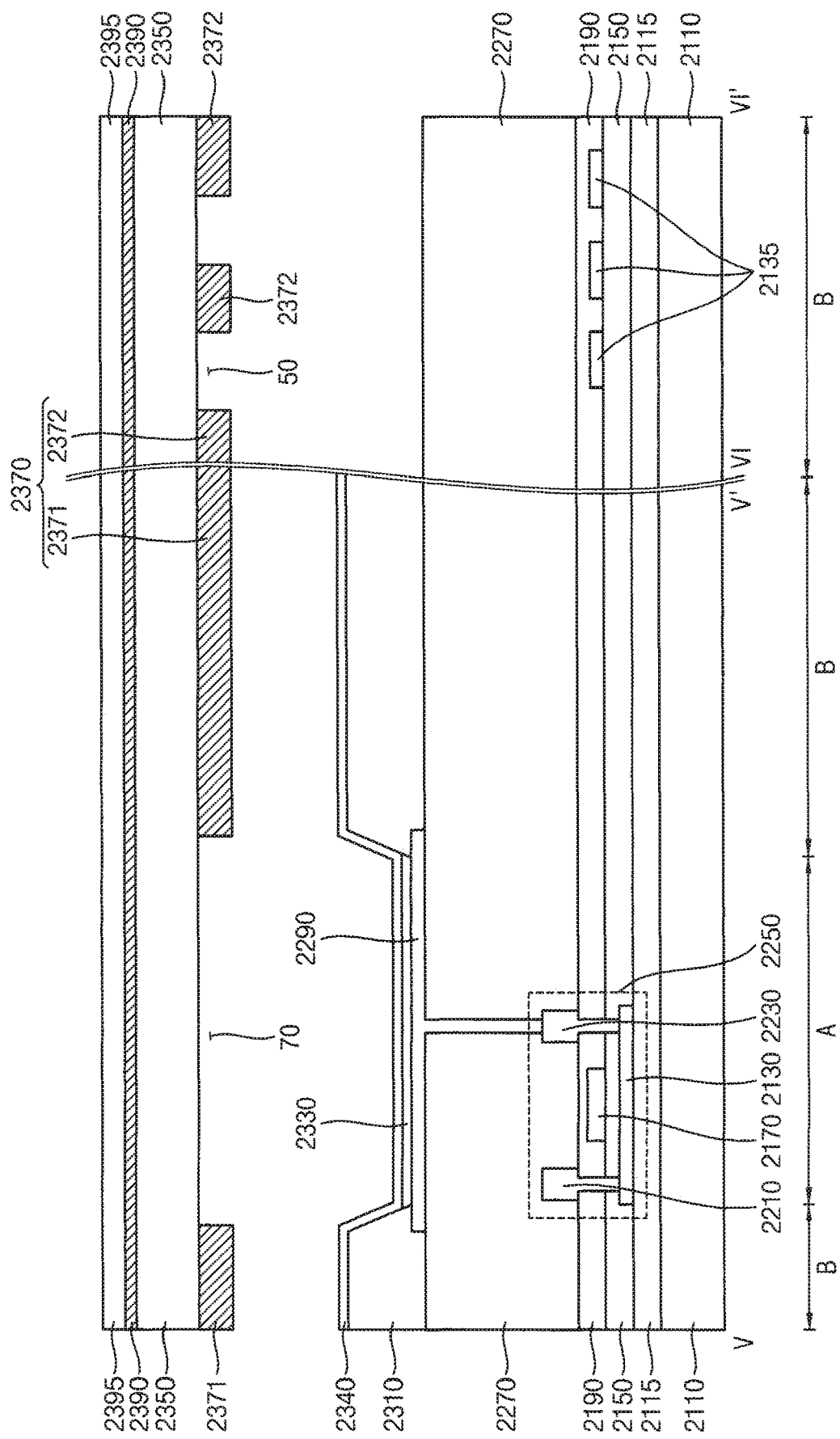

FIG. 20
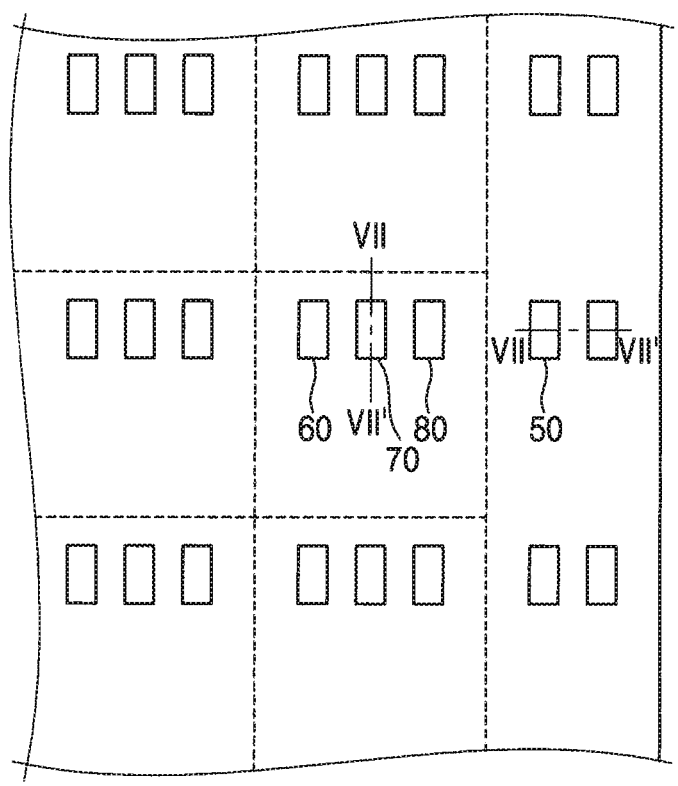
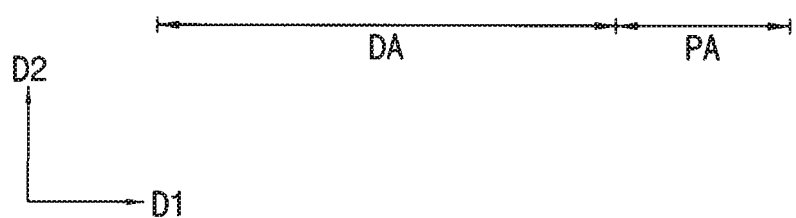

FIG. 27
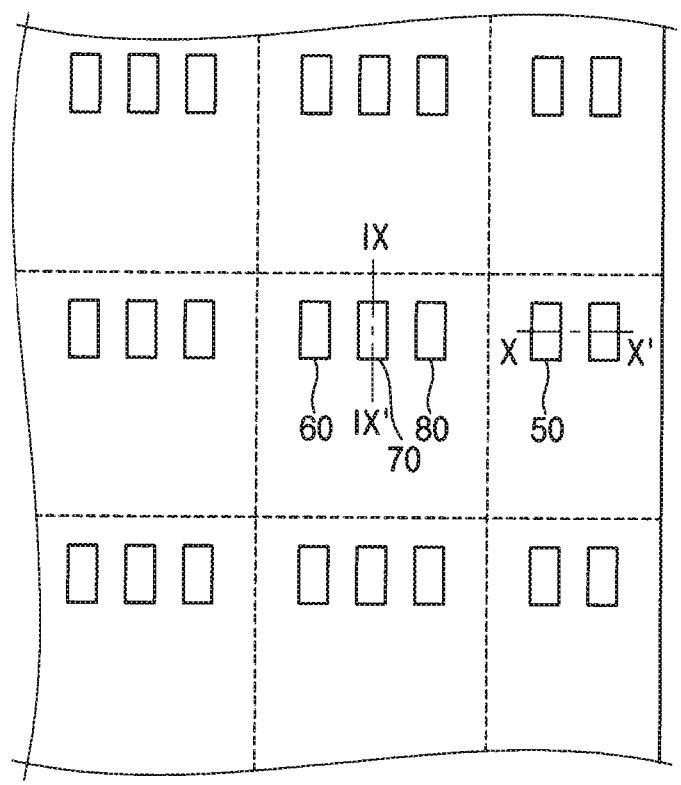
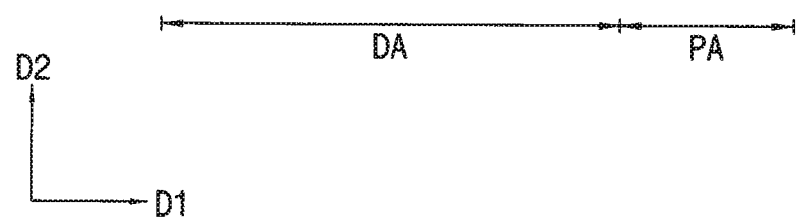

FIG. 32
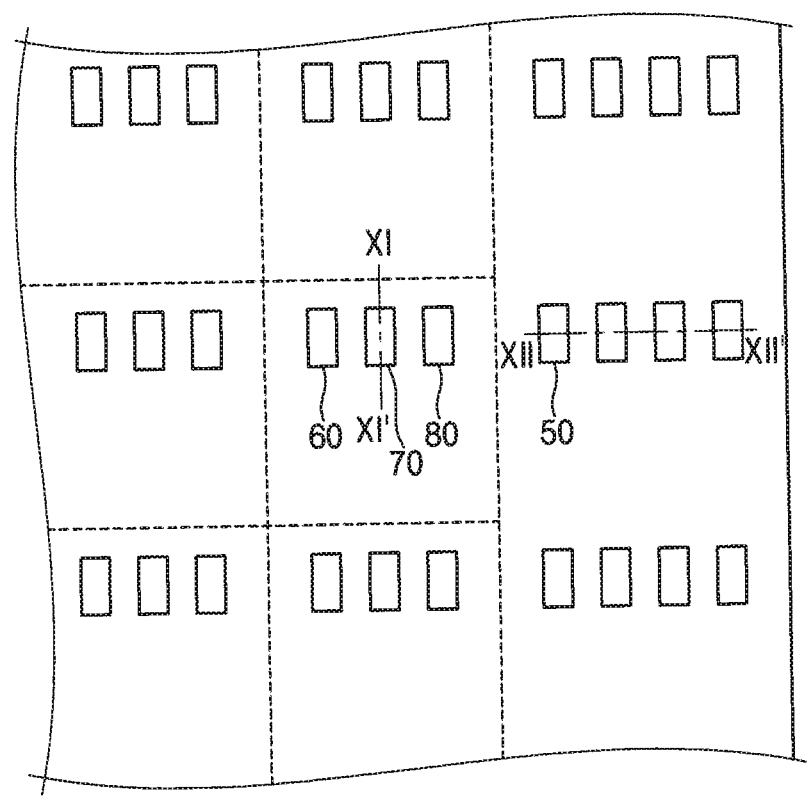
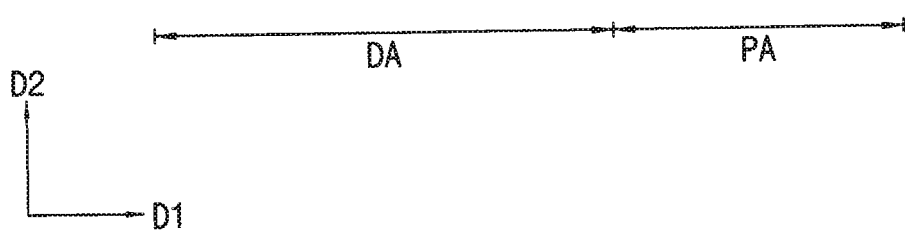

ORGANIC LIGHT EMITTING DISPLAY DEVICE COMPRISING A REFLECTIVE MEMBER HAVING FIRST OPENING FORMED IN DISPLAY AREA AND SECOND OPENING FORMED IN PERIPHERAL AREA

CROSS-REFERENCE TO RELATED APPLICATIONS

This application claims priority under 35 U.S.C. § 119 to Korean Patent Application No. 10-2016-0021400 filed on Feb. 23, 2016 in the Korean Intellectual Property Office (KIPO), the contents of which are herein incorporated by reference in their entireties.

BACKGROUND

1. Field

Exemplary embodiments of the present inventive concept relate to organic light emitting display devices. More specifically, exemplary embodiments of the present inventive concept relate to organic light emitting display devices having improved reflective properties, and their manufacture.

2. Description of the Related Art

Flat panel display (FPD) devices have found wide use in various electronic devices, because the flat panel display device is lightweight and thin as compared to a cathode-ray tube (CRT) display device. Typical examples of a flat panel display device are a liquid crystal display (LCD) device and an organic light emitting diode (OLED) display device. Compared to the LCD, the OLED has many advantages such as a higher luminance and a wider viewing angle. In addition, the OLED display device can be made thinner because the OLED display device does not require a backlight. In the OLED display device, electrons and holes are injected into an organic thin layer through a cathode and an anode, and then recombined in the organic thin layer to generate excitons, thereby generating light of a certain wavelength.

Recently, a mirror OLED device capable of reflecting an image of an object (or target) that is located in the front of the OLED device by including a reflective member has been developed. In addition, an OLED device having a mirror function and a touch function has been developed. The reflective member may be disposed in a display area and a peripheral area surrounding the display area.

However, a reflectivity of a reflective member disposed in the display area may be different from a reflectivity of a reflective member disposed in the peripheral area. Thus, the reflective member disposed in the peripheral area may be seen as separate from the reflective member disposed in the display area.

SUMMARY

Exemplary embodiments of the present inventive concept provide an organic light emitting display device having a mirror function and a touch function.

Exemplary embodiments of the present inventive concept also provide a method of manufacturing the organic light emitting display device.

In an exemplary embodiment of an organic light emitting display device according to the present inventive concept, the organic light emitting display device includes a substrate comprising a display area and a peripheral area and a first reflective member positioned in both the display area and the peripheral area. The first reflective member includes a first opening formed in a light-emitting region of the display area and a second opening formed in the peripheral area.

In an exemplary embodiment, the second opening may have substantially the same shape and the same size as the first opening.

In an exemplary embodiment, the second opening may have a different shape from the first opening.

In an exemplary embodiment, the second opening may have a different size from the first opening.

In an exemplary embodiment, the first reflective member may include a first reflective portion disposed in the display area and a second reflective portion disposed in the peripheral area and integrally formed with the first reflective portion.

In an exemplary embodiment, a reflectivity of the second reflective portion may be substantially equal to a reflectivity of the first reflective portion.

In an exemplary embodiment, the organic light emitting display device may further include a switching element disposed in the light-emitting region and comprising a gate electrode, a source electrode and a drain electrode overlapping the gate electrode, a lower electrode electrically connected to the switching element, a pixel defining layer proximate to the lower electrode and having an opening formed in the light-emitting region, a light emitting layer disposed on the lower electrode, an upper electrode disposed on the pixel defining layer and the light emitting layer and a metal line disposed in the peripheral area.

In an exemplary embodiment, the organic light emitting display device may further include a light-blocking pattern disposed in the peripheral area and overlapping with the metal line.

In an exemplary embodiment, the light-blocking pattern may be disposed on the same layer as the pixel defining layer.

In an exemplary embodiment, the light-blocking pattern may include a black organic material.

In an exemplary embodiment, the organic light emitting display device may further include a second reflective member entirely disposed in the display area and the peripheral area, the second reflective member overlapping the first reflective member, and being thinner than the first reflective member.

In an exemplary embodiment, the organic light emitting display device may further include a second substrate positioned to face the substrate. The first reflective member may be disposed on a first surface of the second substrate, and the second reflective member may be disposed on a second surface opposing the first surface of the second substrate.

In an exemplary embodiment, the organic light emitting display device may further include a second substrate positioned to face the substrate. The first reflective member may be disposed on a first surface of the second substrate, and the second reflective member may be disposed between the second substrate and the first reflective member.

In an exemplary embodiment, the organic light emitting display device may further include a second substrate positioned to face the substrate. The second reflective member may be disposed on a first surface of the second substrate, and the first reflective member may be disposed between the second substrate and the second reflective member.

In an exemplary embodiment, the organic light emitting display device may further include a thin film encapsulation layer disposed on the substrate. The first reflective member may be disposed on the thin film encapsulation layer.

In an exemplary embodiment, the organic light emitting display device may further include a switching element disposed in the light-emitting region and comprising a gate electrode, a source electrode and a drain electrode overlapping the gate electrode, a lower electrode electrically connected to the switching element, a pixel defining layer proximate to the lower electrode and having an opening formed in the light-emitting region, a light emitting layer disposed on the lower electrode, an upper electrode disposed on the pixel defining layer and the light emitting layer and a metal line disposed in the peripheral area.

In an exemplary embodiment, the organic light emitting display device may further include a light-blocking pattern disposed in the peripheral area and overlapping the metal line.

In an exemplary embodiment, the light-blocking pattern may be disposed on the same layer as the pixel defining layer.

In an exemplary embodiment, the light-blocking pattern may include a black organic material.

In an exemplary embodiment, the organic light emitting display device may further include an opposing substrate positioned to face the substrate and a sealing member disposed in the peripheral area so as to couple the substrate to the opposing substrate. The second opening may be disposed between the display area and the sealing member and disposed between the sealing member and an end of the substrate.

In an exemplary embodiment, the second opening may overlap the sealing member.

In an exemplary embodiment of a method of manufacturing an organic light emitting display device, the method includes forming a first reflective layer comprising a metal having a predetermined reflectivity and patterning the first reflective layer to form a first reflective member. The first reflective member includes a first opening formed in a light-emitting region of the display area and a second opening formed in the peripheral area.

In an exemplary embodiment, the method may further include forming a switching element comprising a gate electrode, a source electrode and a drain electrode overlapping the gate electrode, the switching element formed on a substrate comprising a display area and a peripheral area; forming a lower electrode on the switching element; forming a pixel defining layer having an opening formed in the light-emitting region and further formed on the lower electrode; forming a light emitting layer on a portion of the lower electrode that is exposed by the opening of the pixel defining layer; and forming an upper electrode on the pixel defining layer and the light emitting layer.

In an exemplary embodiment, the forming a switching element may further include forming a metal line disposed on a same layer as the gate electrode and electrically connected to the switching element. The forming a pixel defining layer may further include forming a light-blocking pattern overlapping the metal line in the peripheral area.

In an exemplary embodiment, the light-blocking pattern may include a black organic material.

In an exemplary embodiment, the method may further include forming a second reflective member overlapping the first reflective member, the second reflective member being thinner than the first reflective member.

In an exemplary embodiment, the first reflective member may be disposed on a first surface of a substrate, and the second reflective member may be disposed on a second surface opposing the first surface of the substrate.

In an exemplary embodiment, the first reflective member may be disposed on a first surface of a substrate, and the second reflective member may be disposed between the substrate and the first reflective member.

In an exemplary embodiment, the second reflective member may be disposed on a first surface of a substrate, and the first reflective member may be disposed between the substrate and the second reflective member.

In an exemplary embodiment, the method may further include forming a thin film encapsulation layer on the substrate before the patterning. The first reflective member may be disposed on the thin film encapsulation layer.

In an exemplary embodiment, the method may further include forming a switching element comprising a gate electrode, a source electrode and a drain electrode overlapping the gate electrode, the switching element formed on a substrate comprising a display area and a peripheral area; forming a lower electrode on the switching element; forming a pixel defining layer having an opening formed in the light-emitting region and further formed on the lower electrode; forming a light emitting layer on a portion of the lower electrode that is exposed by the opening of the pixel defining layer; and forming an upper electrode on the pixel defining layer and the light emitting layer.

In an exemplary embodiment, the forming a switching element may further include forming a metal line disposed on the same layer as the gate electrode and electrically connected to the switching element. The forming a pixel defining layer may further include forming a light-blocking pattern overlapping with the metal line in the peripheral area.

In an exemplary embodiment, the light-blocking pattern may include a black organic material.

According to the present exemplary embodiment, an organic light emitting display device includes a reflective member including a first reflective portion disposed in the display area and a second reflective portion disposed in the peripheral area. In addition, the second reflective portion has openings having generally the same shape as openings formed in the first reflective portion. Thus, a reflectivity of the first reflective portion may be substantially the same as a reflectivity of the second reflective portion, and thus the first reflective portion and the second reflective portion may be perceived as an integral reflective member. Therefore, a bezel-less mirror organic light emitting display device may be manufactured.

In addition, an organic light emitting display device includes a light-blocking pattern disposed in the peripheral area and overlapping metal lines, and thus the light-blocking pattern may block light due to reflection of the metal lines. Since light from a lower substrate is blocked, a reflectivity of the reflective member may be substantially constant over its area. Thus, a reflectivity of the second reflective portion may be adjusted by adjusting of a shape, a size and the number of the second openings. The reflectivity of the second reflective portion may be the same as a reflectivity of the first reflective portion.

In addition, an organic light emitting display device includes a thin film encapsulation layer. Thus, a flexible organic light emitting display device having a mirror function and a touch function may be manufactured.

BRIEF DESCRIPTION OF THE DRAWINGS

The above and other features and advantages of the present inventive concept will become more apparent by describing in detailed exemplary embodiments thereof with reference to the accompanying drawings, in which:

FIG. 1 is a plan view illustrating an organic light emitting display device according to an exemplary embodiment of the inventive concept;

FIG. 9 is a plan view illustrating an organic light emitting display device according to an exemplary embodiment of the inventive concept;

FIGS. 16A, 16B and 16C are cross-sectional views taken along the line V-V' and the line VI-VI' of FIG. 15;

FIG. 20 is a plan view illustrating an organic light emitting display device according to an exemplary embodiment of the inventive concept;

FIG. 27 is a plan view illustrating an organic light emitting display device according to an exemplary embodiment of the inventive concept;

FIG. 32 is a plan view illustrating an organic light emitting display device according to an exemplary embodiment of the inventive concept.

DETAILED DESCRIPTION OF THE INVENTIVE CONCEPT

Hereinafter, the present inventive concept will be explained in detail with reference to the accompanying drawings. The various Figures are not necessarily to scale. All numerical values are approximate, and may vary. All examples of specific materials and compositions are to be taken as nonlimiting and exemplary only. Other suitable materials and compositions may be used instead.

Figure 2:
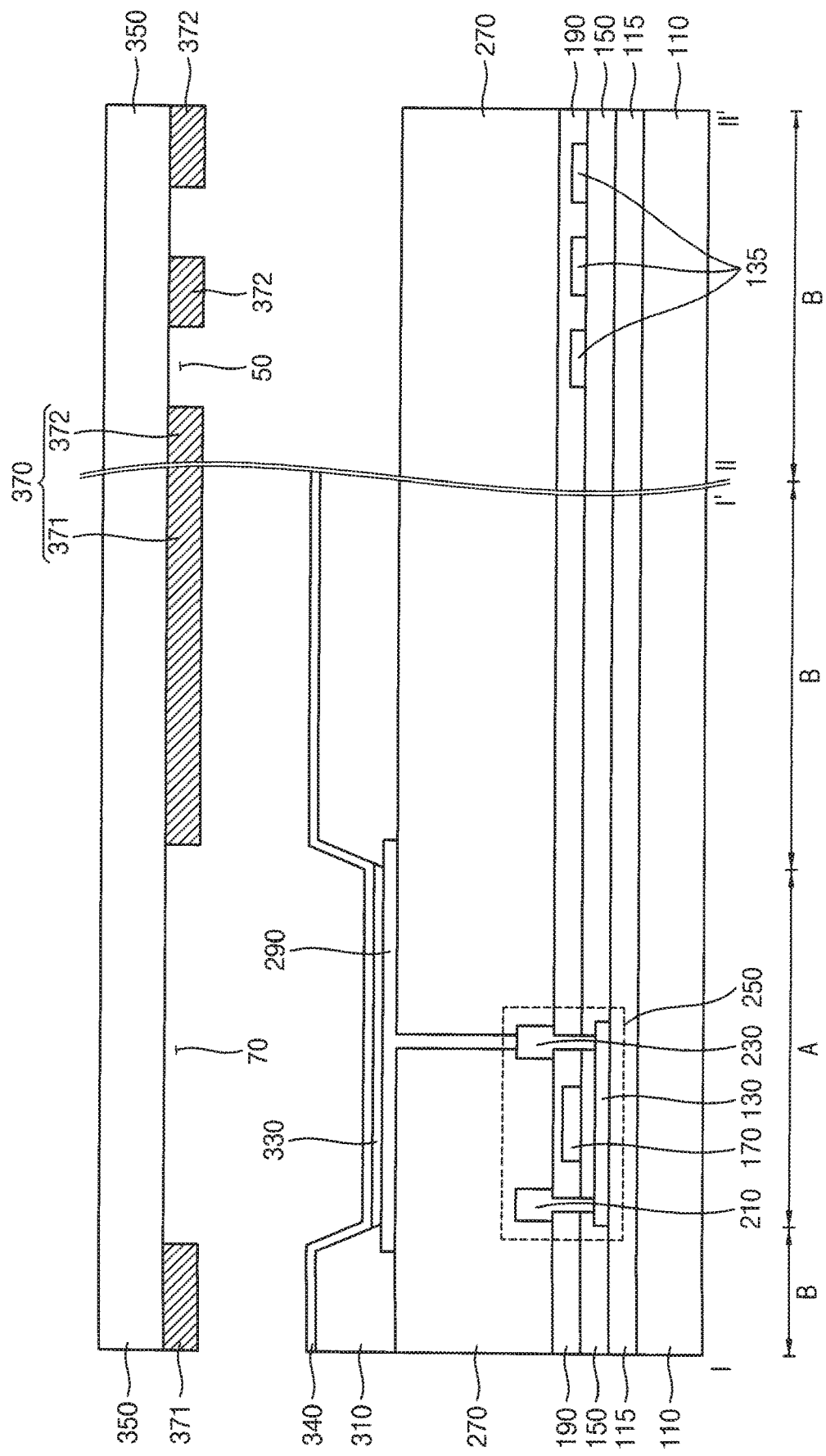
FIG. 2 is a cross-sectional view taken along the line I-I' and the line II-II' of FIG. 1.

FIG. 1 is a plan view illustrating an organic light emitting display device according to an exemplary embodiment of the inventive concept. FIG. 2 is a cross-sectional view taken along the line I-I' and the line II-II' of FIG. 1.

Referring to FIGS. 1 and 2, an organic light emitting display device according to an exemplary embodiment of the inventive concept may include a display area DA and a peripheral area PA.

An organic light emitting display device according to an exemplary embodiment of the inventive concept may include a light-emitting region A and a reflection region B. Pixels 60, 70 and 80 may be positioned in the light-emitting region A. For example, the pixel 60 may be a pixel emitting a red color, the pixel 70 may be a pixel emitting a green color, and the pixel 80 may be a pixel emitting a blue color.

A reflective member 370 may be disposed in the reflection region B. The reflective member 370 may include a first reflective portion 371 disposed in the display area DA and a second reflective portion 372 disposed in the peripheral area PA. The first reflective portion 371 may be integrally formed with the second reflective portion 372.

The reflective member 370 may include a material having predetermined reflectivity. For example, the reflective member 370 may include gold (Au), silver (Ag), aluminum (Al), magnesium (Mg), platinum (Pt), Nickel (Ni), titanium (Ti), etc. Alternatively, the reflective member 370 may be formed of an alloy, metal nitride, conductive metal oxide, etc. For example, the reflective member 370 may include an alloy containing aluminum, aluminum nitride (AlNx), an alloy containing silver, tungsten nitride (WNx), an alloy containing copper, chrome nitride (CrNx), an alloy containing molybdenum, titanium nitride (TiNx), tantalum nitride (TaNx), strontium ruthenium oxide (SRO), zinc oxide (ZnOx), stannum (tin) oxide (SnOx), indium oxide (InOx), gallium oxide (GaOx), etc.

The first reflective portion 371 may have a plurality of first openings 60, 70 and 80. The second reflective portion 372 may have a plurality of second openings 50 having the same shape as the first openings 60, 70 and 80. The first openings 60, 70 and 80 and the second openings 50 may have a quadrangular shape. The second openings 50 may have the same shape and the same size as the first openings 60, 70 and 80. However, the present inventive concept is not limited thereto, the second openings 50 may have a different shape and a different size from any of the first openings 60, 70 and 80.

The first reflective portion 371 may have a plurality of first openings 60, 70 and 80. The second reflective portion 372 may have a plurality of second openings 50. Since the second openings 50 have the same shape as the first openings 60, 70 and 80, a reflectivity of the first reflective portion 371 may be substantially the same as a reflectivity of the second reflective portion 372. However, the present inventive concept is not limited thereto, and when a reflectivity of the first reflective portion 371 is different from the reflectivity of the second reflective portion 372, in order to adjust the reflectivity of the second reflective portion 372, a shape, a size and the number of the second openings 50 may be changed.

An organic light emitting display device according to an exemplary embodiment of the inventive concept includes 7a first substrate 110, a buffer layer 115, a first insulation interlayer 150, a second insulation layer 190, a third insulation layer 270, a light emitting structure, a pixel defining layer 310, a first sensing electrode 370, and a second substrate 350. Here, the light emitting structure includes a switching element 250, a first electrode 290, an emission layer 330 and a second electrode 340. The switching element 250 includes an active pattern 130, a gate electrode 170, a source electrode 210 and a drain electrode 230. The reflective member 370 includes the first openings 60, 70 and 80 formed in the display area and the second openings 50 formed in the peripheral area.

The organic light emitting display device 100 may include a plurality of pixel regions. One pixel region may include a light-emitting region A and a reflection region B. The reflection region B may substantially surround the light-emitting region A. The switching element 250, the first electrode 290, the emission layer 330 and a portion of the second electrode 340 may be disposed in the light-emitting region A. However, the present inventive concept is not limited thereto, and the switching element 250 may be disposed in the reflection region B.

A display image may be displayed in light-emitting region A. An image of an object that is located in the front of the organic light emitting display device 100 may be reflected in the reflection region B.

The light emitting structure may be disposed on the first substrate 110. The first substrate 110 may be formed of transparent materials. For example, the first substrate 110 may include quartz, synthetic quartz, calcium fluoride, fluoride-doped quartz, a soda lime glass, a non-alkali glass etc. Alternatively, the first substrate 110 may be formed of a flexible transparent resin substrate. Here, the flexible transparent resin substrate for the first substrate 110 may include a polyimide substrate. For example, the polyimide substrate may include a first polyimide layer, a barrier film layer, a second polyimide layer, etc.

When the polyimide substrate is thin and flexible, the polyimide substrate may be formed on a rigid glass substrate to help support the formation of the light emitting structure. That is, in example embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the switching element 250, a capacitor, the first electrode 290, the light emitting layer 330, the second electrode 340, etc) may be disposed on the insulation layer.

After the light emitting structure is formed on the insulation layer, the glass substrate may be removed. It may be difficult for the light emitting structure to be directly formed on the polyimide substrate, because the polyimide substrate is thin and flexible. Accordingly, the light emitting structure is formed on a rigid glass substrate, and then the polyimide substrate may serve as the first substrate 110 after removal of the glass substrate. As the organic light emitting display device 100 includes the light-emitting region A and the reflection region B, the first substrate 110 may also include the light-emitting region A and the reflection region B.

A buffer layer 115 may be disposed on the first substrate 110. The buffer layer 115 may extend from the light-emitting region A into the reflection region B. The buffer layer 115 may prevent the diffusion (e.g., an out-gassing) of metal atoms and/or impurities from the first substrate 110. Additionally, the buffer layer 115 may control a rate of heat transfer in a crystallization process for forming the active pattern 130, thereby obtaining a substantially uniform active pattern 130. Furthermore, the buffer layer 115 may improve a surface flatness of the first substrate 110 when a surface of the first substrate 110 is relatively irregular. According to a type of the first substrate 110, at least two buffer layers may be provided on the first substrate 110, or the buffer layer may not be present.

The switching element 250 may include the active pattern 130, the gate electrode 170, the source electrode 210, and the drain electrode 230. For example, the active pattern 130 may be disposed on the first substrate 110. The active pattern 130 may be formed of an oxide semiconductor, an inorganic semiconductor (e.g., amorphous silicon, polysilicon, etc.), an organic semiconductor, etc.

The first insulation layer 150 may be disposed on the active pattern 130. The first insulation layer 150 may cover the active pattern 130 in the light-emitting region A, and may extend in the first direction on the first substrate 110. That is, the first insulation layer 150 may be disposed on substantially the entire first substrate 110. The first insulation layer 150 may be formed of a silicon compound, a metal oxide, etc.

The gate electrode 170 may be disposed on a portion of the first insulation layer 150 under which the active pattern 130 is disposed. The gate electrode 170 may be formed of a metal, an alloy, metal nitride, conductive metal oxide, transparent conductive materials, etc.

The second insulation layer 190 may be disposed on the gate electrode 170. The second insulation layer 190 may cover the gate electrode 170 in the light-emitting region A, and may extend in the first direction on the first substrate 110. That is, the second insulation layer 190 may be disposed on substantially the entire first substrate 110. The second insulation layer 190 may be formed of a silicon compound, a metal oxide, etc.

The source electrode 210 and the drain electrode 230 may be disposed on the second insulation layer 190. The source electrode 210 may be in contact with a first side of the active pattern 130 by removing a portion of the first and second insulation layers 150 and 190. The drain electrode 230 may be in contact with a second side of the active pattern 130 by removing a second portion of the first and second insulation layers 150 and 190. Each of the source electrode 210 and the drain electrode 230 may be formed of a metal, an alloy, metal nitride, conductive metal oxide, transparent conductive materials, etc.

The third insulation layer 270 may be disposed on the source electrode 210 and the drain electrode 230. The third insulation layer 270 may cover the source electrode 210 and the drain electrode 230 in the sub-pixel region, and may extend in the first direction on the first substrate 110. That is, the third insulation layer 270 may be disposed on substantially the entire first substrate 110. The third insulation layer 270 may be formed of a silicon compound, a metal oxide, etc.

The first electrode 290 may be disposed on the third insulation layer 270. The first electrode 290 may be in contact with the source electrode 210 by removing a portion of the third insulation layer 270. That is, the first electrode 290 may be electrically connected to the switching element 250. The first electrode 290 may be formed of a metal, an alloy, metal nitride, conductive metal oxide, transparent conductive materials, etc.

In the present exemplary embodiment, the gate electrode 170 is disposed on the active pattern 130. However, the present inventive concept is not limited thereto, and the gate electrode 170 may instead be disposed under the active pattern 130.

The pixel defining layer 310 may be disposed on the third insulation layer 270 to expose a portion of the first electrode 290. The pixel defining layer 310 may be formed of organic materials or inorganic materials. In this case, the light emitting layer 330 may be disposed on a portion of the first electrode 290 that is exposed by the pixel defining layer 310.

The light emitting layer 330 may be disposed on the exposed first electrode 290. The light emitting layer 330 may be formed using light emitting materials capable of generating different colors of light (e.g., a red color, a blue color, and a green color). However, the present inventive concept is not limited thereto, and the light emitting layer 330 may instead stack light emitting materials capable of generating different colors of light, so as to emit white (or other) colored light.

The second electrode 340 may be disposed on the pixel defining layer 310 and the light emitting layer 330. The second electrode 340 may cover the pixel defining layer 310 and the light emitting layer 330 in the light-emitting region A and the reflection region B, and may extend in the first direction on the first substrate 110. That is, the second electrode 340 may be electrically connected to the first through third pixels. The second electrode 340 may be formed of a metal, an alloy, metal nitride, conductive metal oxide, a transparent conductive material, etc. These may be used alone or in any combination thereof. The first substrate 110 may be coupled to the second substrate 350 by using a sealing member. In addition, a filler may be disposed between the first substrate 110 and the second substrate 350.

The reflective member 370 may include a material having predetermined reflectivity. For example, the reflective member 370 may include gold (Au), silver (Ag), aluminum (Al), magnesium (Mg), platinum (Pt), Nickel (Ni), titanium (Ti), etc. Alternatively, the reflective member 370 may be formed of an alloy, metal nitride, conductive metal oxide, etc. For example, the reflective member 370 may include an alloy containing aluminum, aluminum nitride (AlNx), an alloy containing silver, tungsten nitride (WNx), an alloy containing copper, chrome nitride (CrNx), an alloy containing molybdenum, titanium nitride (TiNx), tantalum nitride (TaNx), strontium ruthenium oxide (SRO), zinc oxide (ZnOx), stannum oxide (SnOx), indium oxide (InOx), gallium oxide (GaOx), etc.

The second substrate 350 and the first substrate 110 may include substantially the same materials. For example, the second substrate 350 may be formed of quartz, synthetic quartz, calcium fluoride, fluoride-doped quartz, soda lime glass, non-alkali glass, etc. In some example embodiments, the second substrate 350 may be formed of a transparent inorganic material or flexible plastic. For example, the second substrate 350 may include a flexible transparent resin substrate. In this case, to increase flexibility of the organic light emitting display device 100, the second substrate 350 may include a stacked structure where at least one organic layer and at least one inorganic layer are alternately stacked.

FIGS. 3 to 8 are cross-sectional views illustrating a method of manufacturing the organic light emitting display device of FIG. 2.

Figure 3:
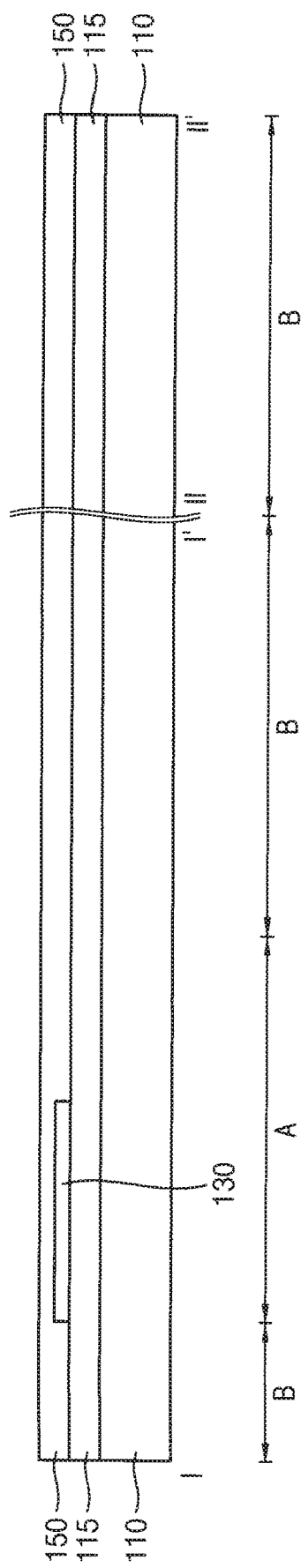
FIG. 3, FIG. 4, FIG. 5, FIG. 6, FIG. 7 and FIG. 8 are cross-sectional views illustrating a method of manufacturing the organic light emitting display device of FIG. 2.

Referring to FIG. 3, the buffer layer 115 is formed on the first substrate 110. Thereafter, the active pattern 130 and the first insulation layer 150 are formed on the buffer layer 115.

The first substrate 110 may include quartz, synthetic quartz, calcium fluoride, fluoride-doped quartz, a soda lime glass, a non-alkali glass, etc.

The first substrate 110 may be formed of transparent materials. For example, the first substrate 110 may include quartz, synthetic quartz, calcium fluoride, fluoride-doped quartz, a soda lime glass, a non-alkali glass, etc. Alternatively, the first substrate 110 may be formed of a flexible transparent resin substrate. Here, the flexible transparent resin substrate for the first substrate 110 may include a polyimide substrate. For example, the polyimide substrate may include a first polyimide layer, a barrier film layer, a second polyimide layer, etc. When the polyimide substrate is thin and flexible, it may be formed on a rigid glass substrate to help support the formation of the light emitting structure. That is, in example embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the switching element 250, a capacitor, the first electrode 290, the light emitting layer 330, the second electrode 340, etc) may be disposed on the insulation layer.

After the light emitting structure is formed on the insulation layer, the glass substrate may be removed. It may be difficult that the light emitting structure is directly formed on the polyimide substrate because the polyimide substrate is thin and flexible. Accordingly, the light emitting structure may be formed on a rigid glass substrate, and then the polyimide substrate may serve as the first substrate 110 after the of the glass substrate. As the organic light emitting display device 100 includes the light-emitting region A and the reflection region B, the first substrate 110 may also include the light-emitting region A and the reflection region B.

A buffer layer 115 may be disposed on the first substrate 110. The buffer layer 115 may extend from the light-emitting region A into the reflection region B. The buffer layer 115 may prevent the diffusion (e.g., out-gassing) of metal atoms and/or impurities from the first substrate 110. Additionally, the buffer layer 115 may control a rate of heat transfer in a crystallization process for forming the active pattern 130, thereby obtaining a substantially uniform active pattern 130. Furthermore, the buffer layer 115 may improve a surface flatness of the first substrate 110 when a surface of the first substrate 110 is relatively irregular. According to a type of the first substrate 110, at least two buffer layers may be provided on the first substrate 110, or the buffer layer may not be present.

The active pattern 130 may be formed of an oxide semiconductor, an inorganic semiconductor (e.g., amorphous silicon, polysilicon, etc.), an organic semiconductor, etc.

The first insulation layer 150 may be disposed on the active pattern 130. The first insulation layer 150 may cover the active pattern 130 in the light-emitting region A, and may extend in the first direction on the first substrate 110. That is, the first insulation layer 150 may be disposed on substantially the entire first substrate 110. The first insulation layer 150 may be formed of a silicon compound, a metal oxide, etc.

Figure 4:
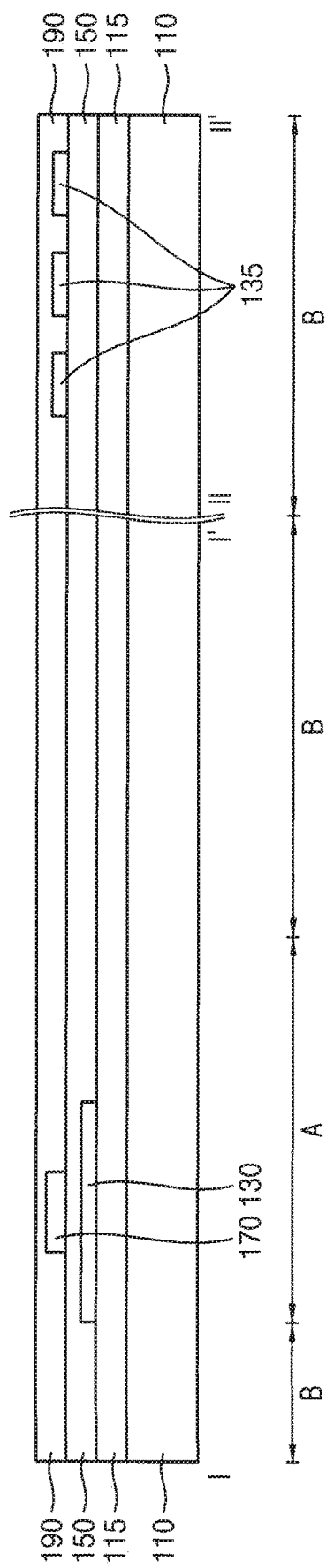

Referring to FIG. 4, the gate electrode 170, a metal line 135 and the second insulation layer 190 are formed on the first substrate 110 after the first insulation layer 150 is formed.

The gate electrode 170 may be disposed on a portion of the first insulation layer 150 under which the active pattern 130 is disposed. The gate electrode 170 may be formed of a metal, an alloy, metal nitride, conductive metal oxide, transparent conductive materials, etc.

The metal line 135 may be disposed on the same layer as the gate electrode 170. The metal line 135 may include the same material as the gate electrode 170. The metal line 135 may be formed of a metal, an alloy, metal nitride, conductive metal oxide, transparent conductive materials, etc. The metal line 135 may be a line, a circuit or a common line electrically connected to the switching element 250. However, the present inventive concept is not limited thereto, and the metal line 135 may instead, for example, be disposed on the same layer as the source electrode 210 and the drain electrode 230.

The second insulation layer 190 may be disposed on the gate electrode 170. The second insulation layer 190 may cover the gate electrode 170 in the light-emitting region A, and may extend in the first direction on the first substrate 110. That is, the second insulation layer 190 may be disposed on the entire first substrate 110. The second insulation layer 190 may be formed of a silicon compound, a metal oxide, etc.

Figure 5:
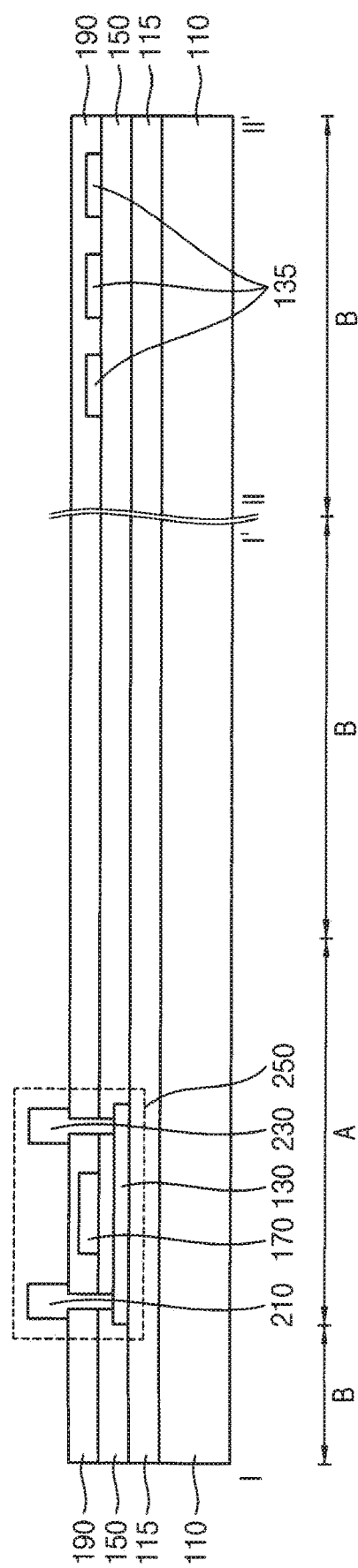

Referring to FIG. 5, the source electrode 210 and the drain electrode 230 are formed on the first substrate 110 after the second insulation layer 190 is formed.

The source electrode 210 and the drain electrode 230 may be disposed on the second insulation layer 190. The source electrode 210 may be in contact with a first side of the active layer 130 by removing a portion of the first and second insulation layers 150 and 190. The drain electrode 230 may be in contact with a second side of the active layer 130 by removing a second portion of the first and second insulation layers 150 and 190. Each of the source electrode 210 and the drain electrode 230 may be formed of a metal, an alloy, metal nitride, conductive metal oxide, transparent conductive materials, etc.

In the present exemplary embodiment, the gate electrode 170 is disposed on the active pattern 130. However, the present inventive concept is not limited thereto, and the gate electrode 170 may instead, for example, be disposed under the active pattern 130.

Figure 6:
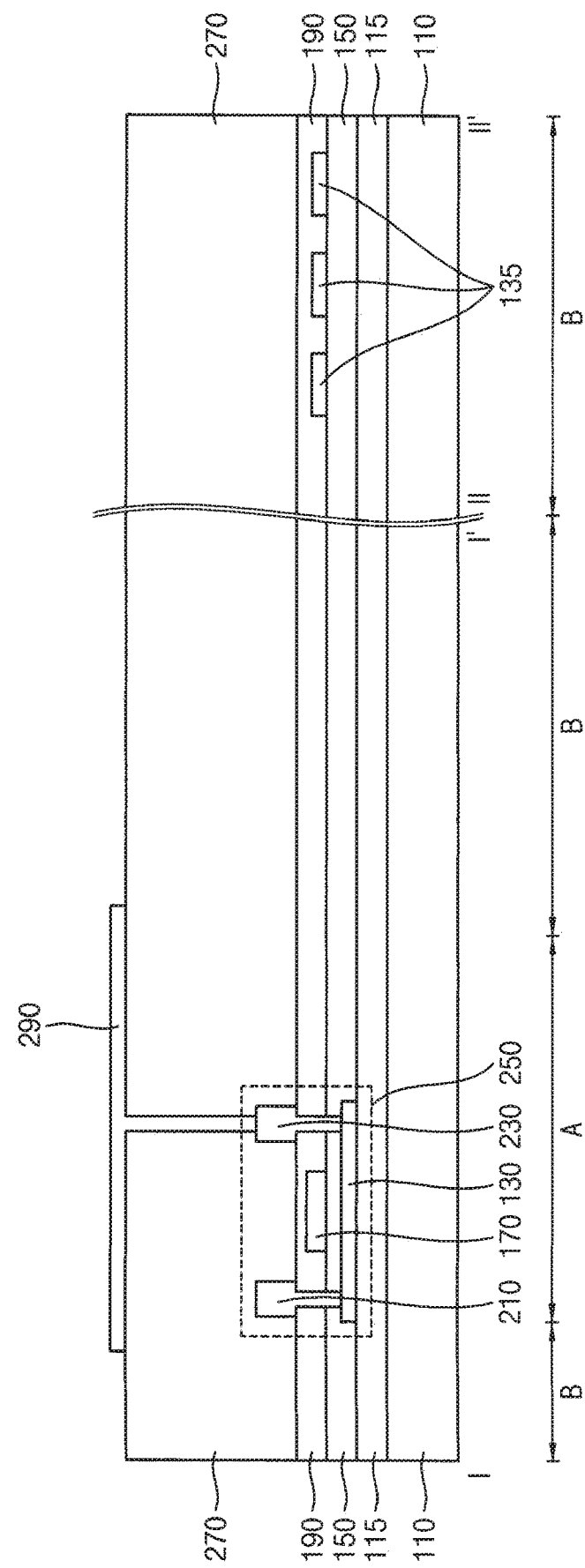

Referring to FIG. 6, the third insulation layer 270 and the first electrode 290 are formed on the first substrate 110 over the source electrode 210 and the drain electrode 230.

The third insulation layer 270 may be disposed on the source electrode 210 and the drain electrode 230. The third insulation layer 270 may cover the source electrode 210 and the drain electrode 230 in the sub-pixel region A, and may extend in the first direction on the first substrate 110. That is, the third insulation layer 270 may be disposed on substantially the entire first substrate 110. The third insulation layer 270 may be formed of a silicon compound, a metal oxide, etc.

The first electrode 290 may be disposed on the third insulation layer 270. The first electrode 290 may be in contact with the source electrode 210 by removing a portion of the third insulation layer 270. In addition, the first electrode 290 may be electrically connected to the switching element 250. The first electrode 290 may be formed of a metal, an alloy, metal nitride, conductive metal oxide, transparent conductive materials, etc.

Figure 7:
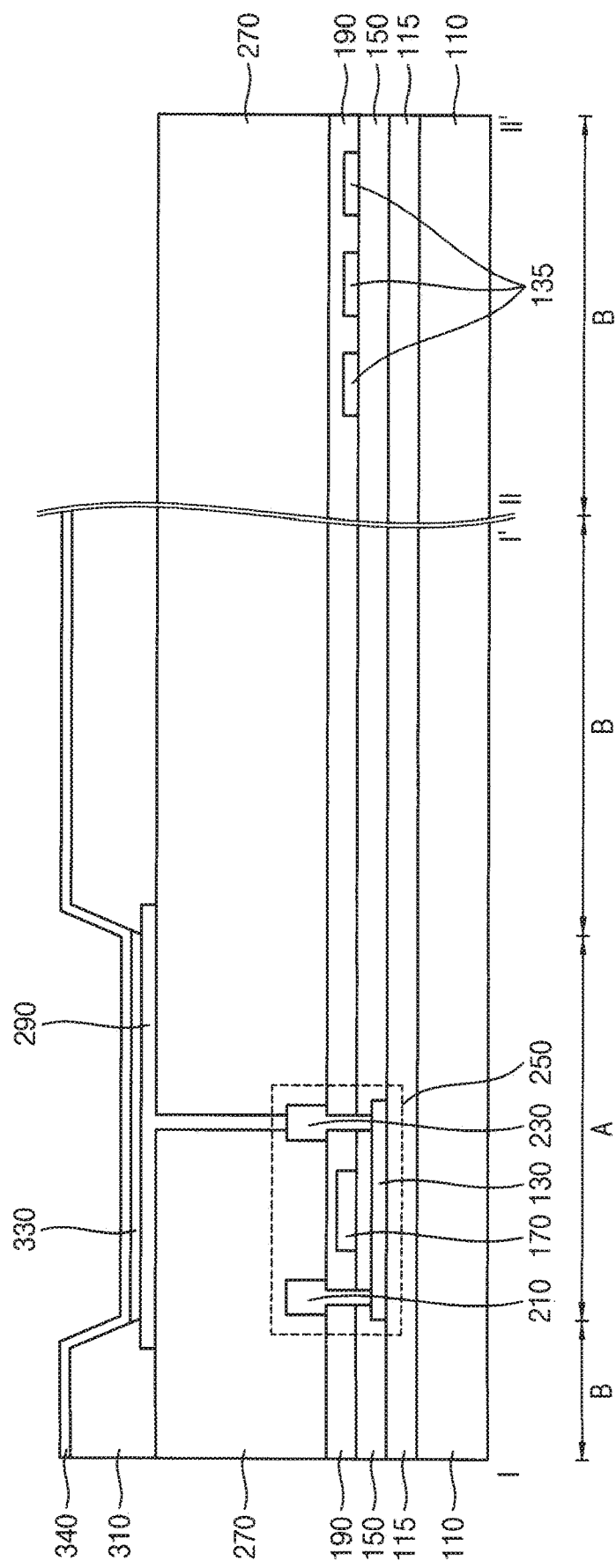

Referring to FIG. 7, the pixel defining layer 310, the light emitting layer 330 and the second electrode 340 are formed on the first substrate 110 over the first electrode 290.

The pixel defining layer 310 may be disposed on the third insulation layer 270 to expose a portion of the first electrode 290. The pixel defining layer 310 may be formed of organic materials or inorganic materials. In this case, the light emitting layer 330 may be disposed on the portion of first electrode 290 that is exposed by the pixel defining layer 310.

The light emitting layer 330 may be disposed on the exposed first electrode 290. The light emitting layer 330 may be formed using light emitting materials capable of generating different colors of light (e.g., a red color, a blue color, and a green color). However, the present inventive concept is not limited thereto, and the light emitting layer 330 may instead stack light emitting materials capable of generating different colors of light, so as to emit white or other colored light.

The second electrode 340 may be disposed on the pixel defining layer 310 and the light emitting layer 330. The second electrode 340 may cover the pixel defining layer 310 and the light emitting layer 330 in the light-emitting region A and the reflection region B, and may extend in the first direction on the first substrate 110. That is, the second electrode 340 may be electrically connected to the first through third pixels 60, 70 and 80. The second electrode 340 may be formed of a metal, an alloy, metal nitride, conductive metal oxide, a transparent conductive material, etc. These may be used alone or in any combination thereof.

The pixel defining layer 310 and the second electrode 340 may not be formed in (i.e. may be removed from) the peripheral area PA. However, the present inventive concept is not limited thereto, at least one of the pixel defining layer 310 and the second electrode 340 may be formed in the peripheral area PA or at least portion of the peripheral area PA.

Figure 8:
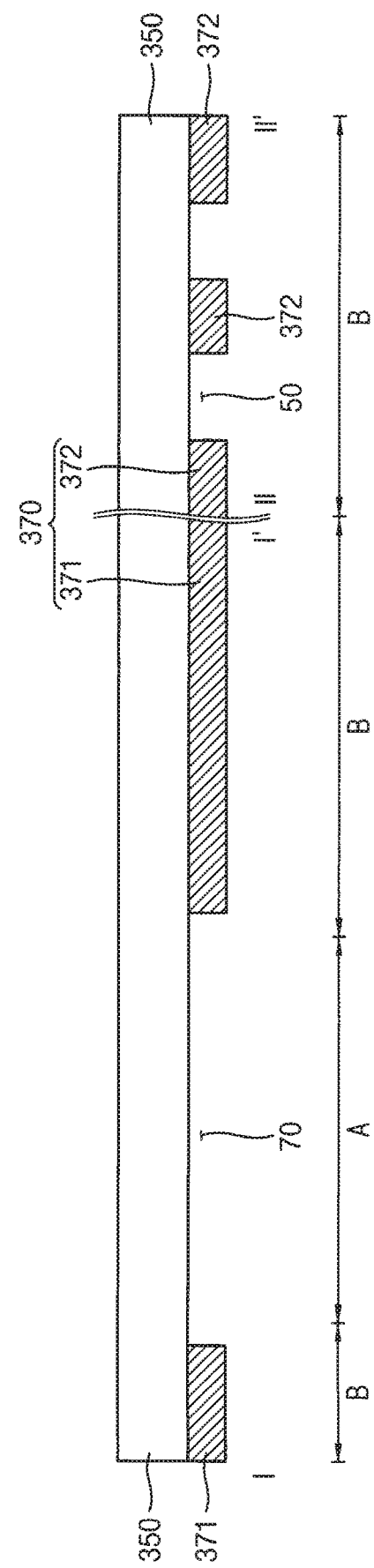

Referring to FIG. 8, the reflective member 370 is formed on the second substrate 350.

The second substrate 350 and the first substrate 110 may include substantially the same materials. For example, the second substrate 350 may be formed of quartz, synthetic quartz, calcium fluoride, fluoride-doped quartz, soda lime glass, non-alkali glass, etc.

The reflective member 370 may include a first reflective portion 371 disposed in the display area DA, and a second reflective portion 372 disposed in the peripheral area PA. The first reflective portion 371 may be integrally formed with the second reflective portion 372.

The reflective member 370 may include a material having predetermined reflectivity. For example, the reflective member 370 may include gold (Au), silver (Ag), aluminum (Al), magnesium (Mg), platinum (Pt), Nickel (Ni), titanium (Ti), etc. Alternatively, the reflective member 370 may be formed of an alloy, metal nitride, conductive metal oxide, etc. For example, the reflective member 370 may include an alloy containing aluminum, aluminum nitride (AlNx), an alloy containing silver, tungsten nitride (WNx), an alloy containing copper, chrome nitride (CrNx), an alloy containing molybdenum, titanium nitride (TiNx), tantalum nitride (TaNx), strontium ruthenium oxide (SRO), zinc oxide (ZnOx), stannum oxide (SnOx), indium oxide (InOx), gallium oxide (GaOx), etc.

The first reflective portion 371 may have a plurality of first openings 60, 70 and 80. The second reflective portion 372 may have a plurality of second openings 50 having the same general shape as the first openings 60, 70 and 80. For example, the first openings 60, 70 and 80 and the second openings 50 may have a quadrangular shape. The second openings 50 may have the same shape and the same size as the first openings 60, 70 and 80. However, the present inventive concept is not limited thereto, and the second openings 50 may instead have a different shape and/or a different size from the first openings 60, 70 and 80.

The first reflective portion 371 may have a plurality of first openings 60, 70 and 80. The second reflective portion 372 may have a plurality of second openings 50. Since the second openings 50 have the same shape as the first openings 60, 70 and 80, a reflectivity of the first reflective portion 371 may be the same as a reflectivity of the second reflective portion 372. However, the present inventive concept is not limited thereto, and when a reflectivity of the first reflective portion 371 is different from the reflectivity of the second reflective portion 372, in order to adjust the reflectivity of the second reflective portion 372, a shape, a size and the number of the second openings 50 may be changed.

Figure 10:
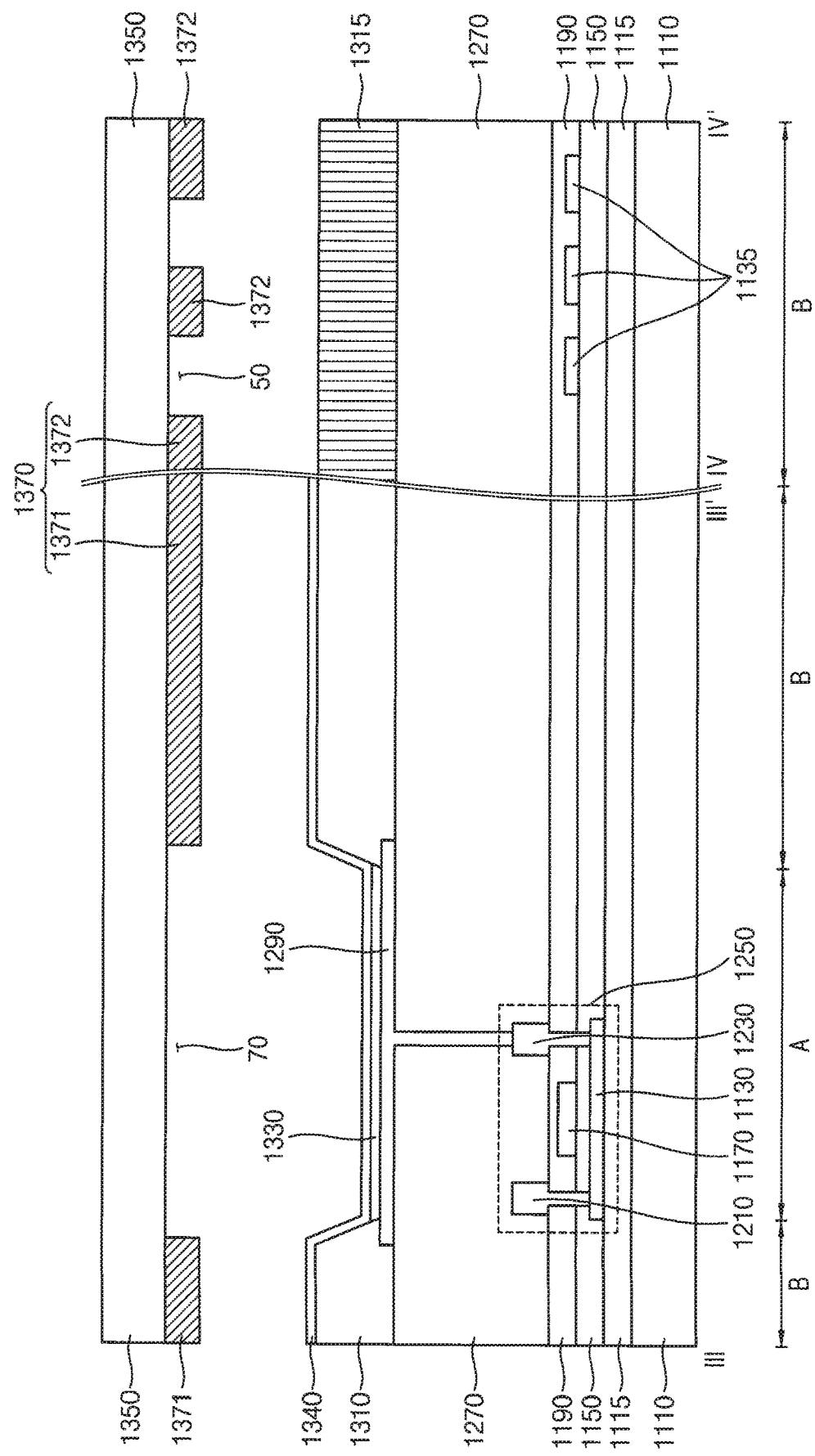
FIG. 10 is a cross-sectional view taken along the line III-III' and the line IV-IV' of FIG. 9.

FIG. 9 is a plan view illustrating an organic light emitting display device according to an exemplary embodiment of the inventive concept. FIG. 10 is a cross-sectional view taken along the line III-III' and the line IV-IV' of FIG. 9.

The organic light emitting display device according to the present exemplary embodiment is substantially the same as the organic light emitting display device of FIGS. 1 and 2 except for the presence of a light-blocking pattern 1315, and thus same reference numerals are used for same elements and repetitive explanation will be omitted.

Referring to FIGS. 9 and 10, an organic light emitting display device according to an exemplary embodiment of the inventive concept may include a light-blocking pattern 1315.

The light-blocking pattern 1315 overlaps the metal line 1135. The light-blocking pattern 1315 may be disposed on the same layer as the pixel defining layer 1310.

The light-blocking pattern 1315 may include an opaque material. For example, the light-blocking pattern 1315 may include a black organic material. The light-blocking pattern 1315 may include a carbon or a cobalt. Therefore, the light-blocking pattern 1315 may block light due to reflection by metal wirings.

The reflective member 1370 may include a first reflective portion 1371 disposed in the display area DA and a second reflective portion 1372 disposed in the peripheral area PA. The first reflective portion 1371 may be integrally formed with the second reflective portion 1372.

The first reflective portion 1371 may have a plurality of first openings 60, 70 and 80. The second reflective portion 1372 may have a plurality of second openings 50 having substantially the same shape as the first openings 60, 70 and 80. The first openings 60, 70 and 80 and the second openings 50 may have a generally quadrangular shape. The second openings 50 may have the same shape and the same size as the first openings 60, 70 and 80. However, the present inventive concept is not limited thereto, and the second openings 50 may alternatively have a different shape and a different size from the first openings 60, 70 and 80.

The first reflective portion 1371 may have a plurality of first openings 60, 70 and 80. The second reflective portion 1372 may have a plurality of second openings 50. Since the second openings 50 have the same shape as the first openings 60, 70 and 80, a reflectivity of the first reflective portion 1371 may be the same as a reflectivity of the second reflective portion 1372. However, the present inventive concept is not limited thereto, and when a reflectivity of the first reflective portion 1371 is different from the reflectivity of the second reflective portion 1372, in order to adjust the reflectivity of the second reflective portion 1372, a shape, a size and the number of the second openings 50 may be changed.

In the present exemplary embodiment, the light-blocking pattern 1315 overlaps the metal line 1135, and thus the light-blocking pattern 1315 may block light due to reflection from the metal line 1135. Since light from a lower substrate is blocked, a reflectivity of the reflective member 1370 may be constant. Thus, a reflectivity of the second reflective portion 1372 may be adjusted by adjusting of a shape, a size and the number of the second openings 50. The reflectivity of the second reflective portion 1372 may be substantially the same as a reflectivity of the first reflective portion 1371.

Figure 11:
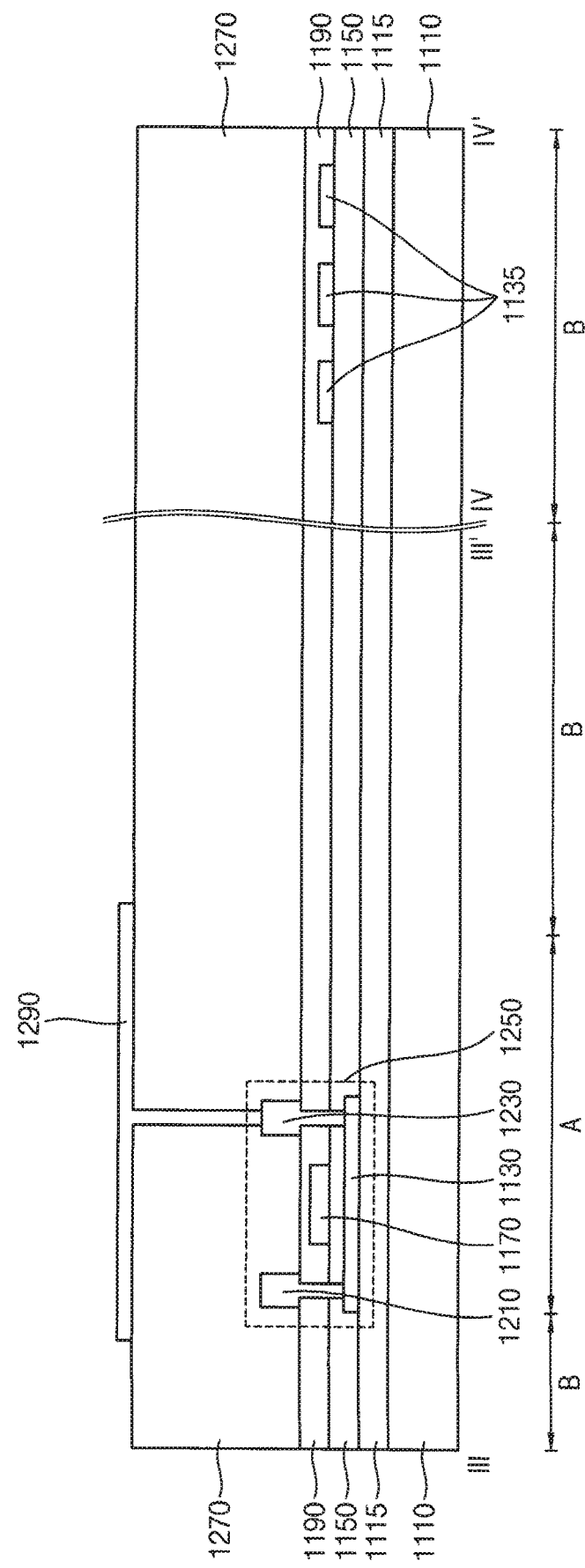
FIG. 11, FIG. 12, and FIG. 13 are cross-sectional views illustrating a method of manufacturing the organic light emitting display device of FIG. 10.
Figure 12:
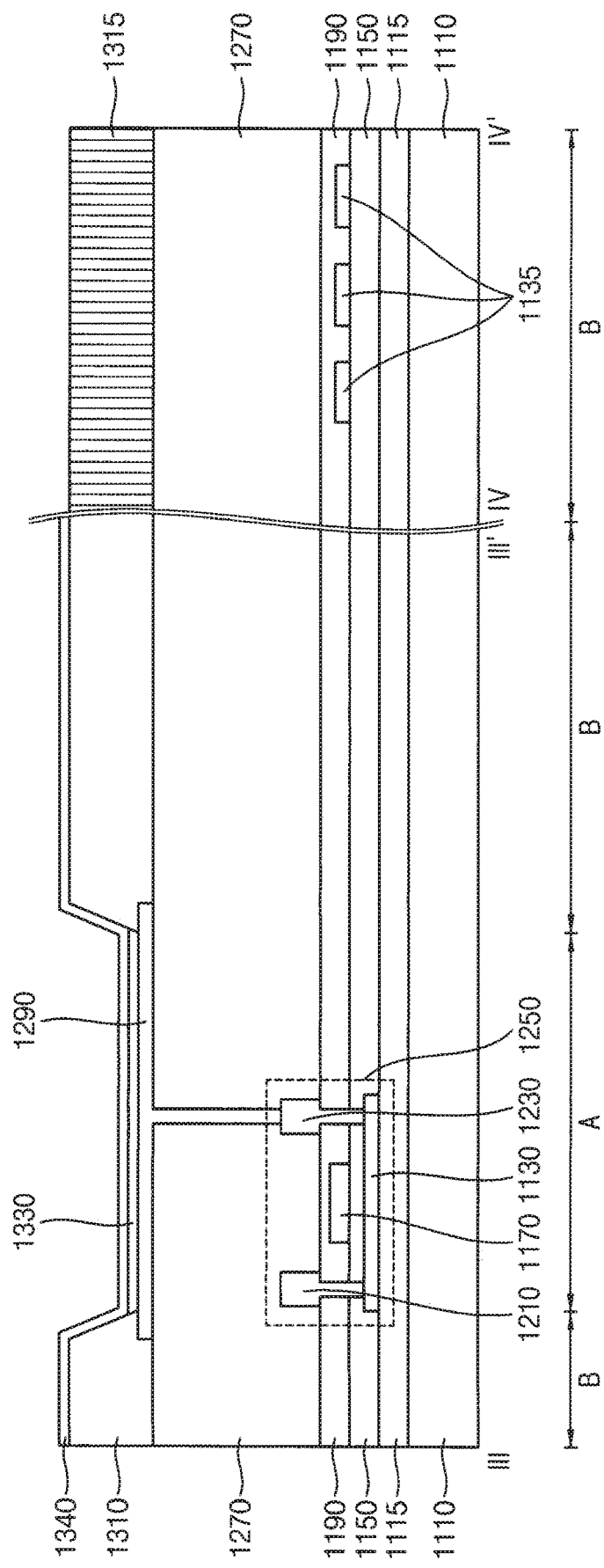
Figure 13:
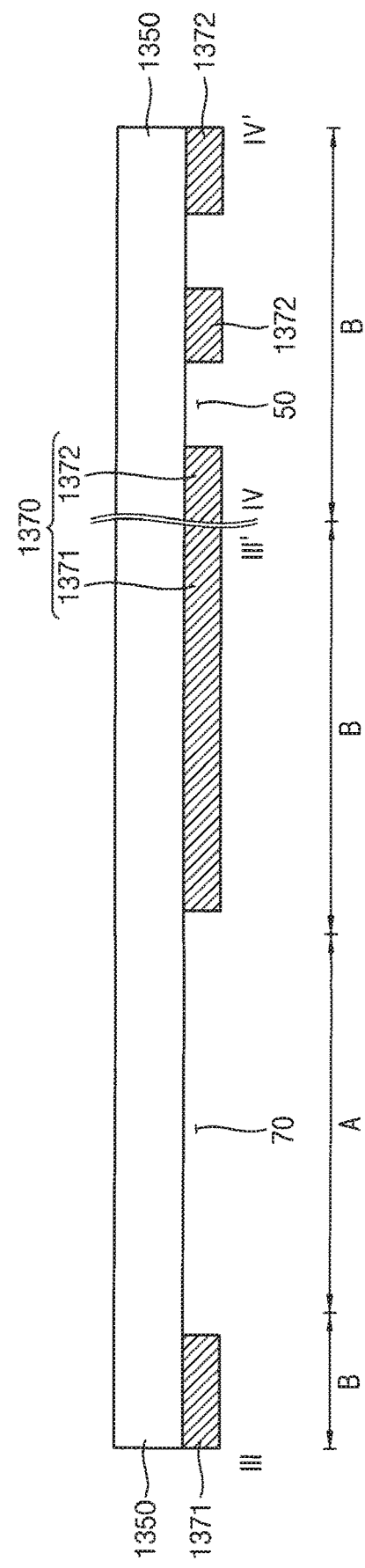

FIGS. 11 to 13 are cross-sectional views illustrating a method of manufacturing the organic light emitting display device of FIG. 10.

Referring to FIG. 11, the third insulation layer 1270 and the first electrode 1290 are formed on the first substrate 1110 on which the source electrode 1210 and the drain electrode 1230 are formed.

The third insulation layer 1270 may be disposed on the source electrode 1210 and the drain electrode 1230. The third insulation layer 1270 may cover the source electrode 1210 and the drain electrode 1230 in the sub-pixel region A, and may extend in the first direction on the first substrate 1110. That is, the third insulation layer 1270 may be disposed on the entire first substrate 1110. The third insulation layer 1270 may be formed of a silicon compound, a metal oxide, etc.

The first electrode 1290 may be disposed on the third insulation layer 1270. The first electrode 1290 may be in contact with the source electrode 1210 by removing a portion of the third insulation layer 1270. In this manner, the first electrode 1290 may be electrically connected to the switching element 1250. The first electrode 1290 may be formed of a metal, an alloy, metal nitride, conductive metal oxide, transparent conductive materials, etc.

Referring to FIG. 12 and FIG. 7, the pixel defining layer 1310, the light-blocking pattern 1315, the light emitting layer 1330 and the second electrode 1340 are formed on the first substrate 1110 on which the first electrode 1290 is formed.

The pixel defining layer 1310 may be disposed on the third insulation layer 1270 to expose a portion of the first electrode 1290. The pixel defining layer 1310 may be formed of organic materials or inorganic materials. In this case, the light emitting layer 1330 may be disposed on a portion that the first electrode 1290 is exposed by the pixel defining layer 1310.

The light-blocking pattern 1315 may include an opaque material. For example, the light-blocking pattern 1315 may include a black organic material. The light-blocking pattern 1315 may include a carbon or a cobalt. Therefore, the light-blocking pattern 1315 may block light due to reflection by metal wirings.

The light emitting layer 1330 may be disposed on the exposed first electrode 1290. The light emitting layer 1330 may be formed using light emitting materials capable of generating different colors of light (e.g., a red color, a blue color, and a green color). However, the present inventive concept is not limited thereto, the light emitting layer 1330 may stack light emitting materials capable of generating different colors of light, so as to emit white or other colored light.

The second electrode 1340 may be disposed on the pixel defining layer 1310 and the light emitting layer 1330. The second electrode 1340 may cover the pixel defining layer 1310 and the light emitting layer 1330 in the light-emitting region A and the reflection region B, and may extend in the first direction on the first substrate 1110. That is, the second electrode 1340 may be electrically connected to the first through third pixels. The second electrode 1340 may be formed of a metal, an alloy, metal nitride, conductive metal oxide, a transparent conductive material, etc. These may be used alone or in any combination thereof.

Referring to FIG. 13, the reflective member 1370 is formed on the second substrate 1350.

The second substrate 1350 and the first substrate 1110 may include substantially the same materials. For example, the second substrate 1350 may be formed of quartz, synthetic quartz, calcium fluoride, fluoride-doped quartz, soda lime glass, non-alkali glass, etc.

The reflective member 1370 may include a first reflective portion 1371 disposed in the display area DA, and a second reflective portion 1372 disposed in the peripheral area PA. The first reflective portion 1371 may be integrally formed with the second reflective portion 1372.

The reflective member 1370 may include a material having predetermined reflectivity. For example, the reflective member 1370 may include gold (Au), silver (Ag), aluminum (Al), magnesium (Mg), platinum (Pt), Nickel (Ni), titanium (Ti), etc. Alternatively, the reflective member 1370 may be formed of an alloy, metal nitride, conductive metal oxide, etc. For example, the reflective member 1370 may include an alloy containing aluminum, aluminum nitride (AlNx), an alloy containing silver, tungsten nitride (WNx), an alloy containing copper, chrome nitride (CrNx), an alloy containing molybdenum, titanium nitride (TiNx), tantalum nitride (TaNx), strontium ruthenium oxide (SRO), zinc oxide (ZnOx), stannum oxide (SnOx), indium oxide (InOx), gallium oxide (GaOx), etc.

The first reflective portion 1371 may have a plurality of first openings 60, 70 and 80. The second reflective portion 1372 may have a plurality of second openings 50 having at least approximately the same shape as the first openings 60, 70 and 80. The first openings 60, 70 and 80 and the second openings 50 may have a generally quadrangular shape. The second openings 50 may have generally the same shape and the same size as the first openings 60, 70 and 80. However, the present inventive concept is not limited thereto, and the second openings 50 may instead have a different shape and a different size from the first openings 60, 70 and 80.

Since the second openings 50 have the same shape as the first openings 60, 70 and 80, a reflectivity of the first reflective portion 1371 may be the same as a reflectivity of the second reflective portion 1372. However, the present inventive concept is not limited thereto, and when a reflectivity of the first reflective portion 1371 is different from the reflectivity of the second reflective portion 1372, in order to adjust the reflectivity of the second reflective portion 1372, a shape, a size and the number of the second openings 50 may be changed.

Figure 14:
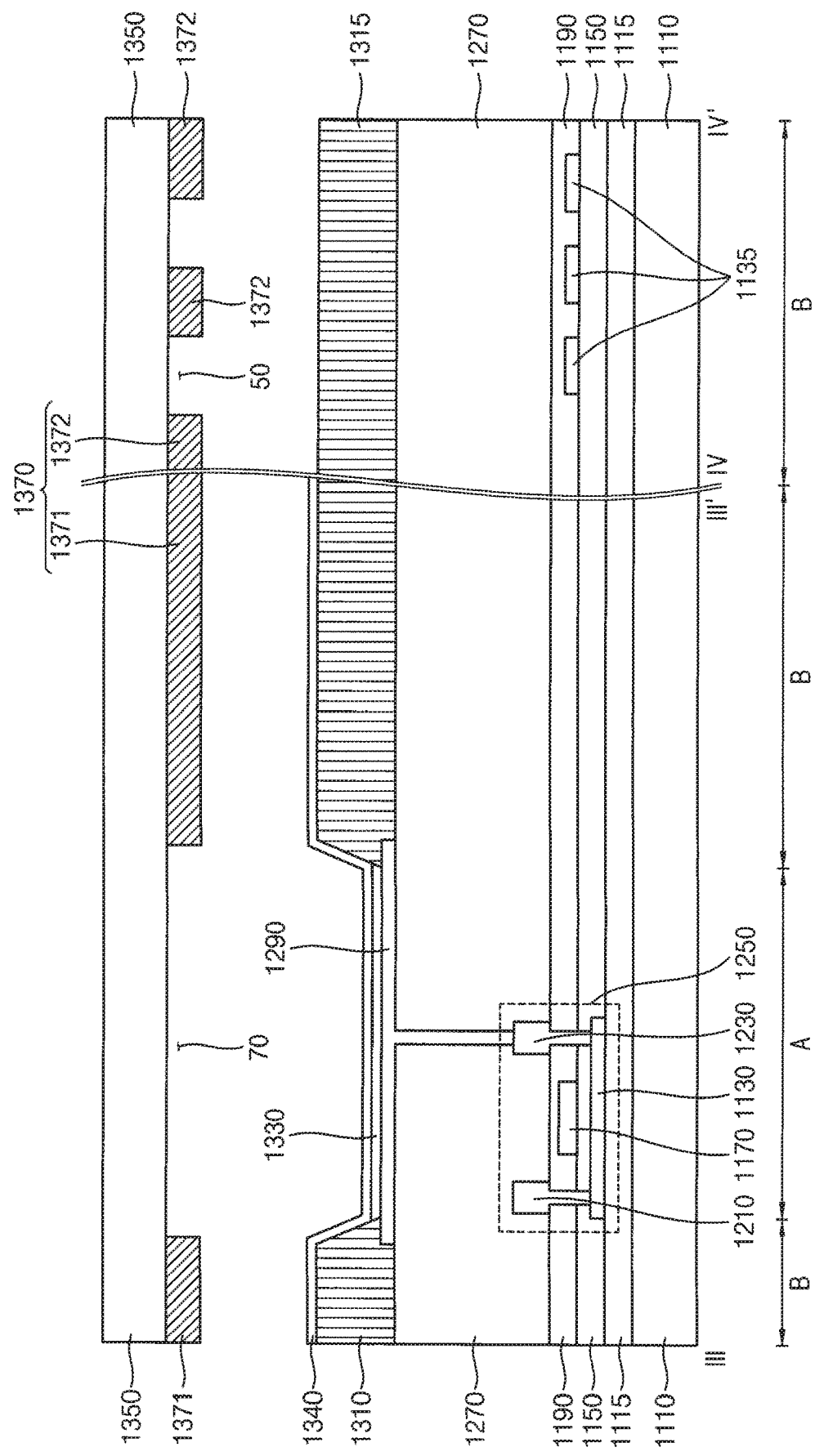
FIG. 14 is a cross-sectional view taken along the line III-III' and the line IV-IV' of FIG. 9.

FIG. 14 is a cross-sectional view taken along the line III-III' and the line IV-IV' of FIG. 9.

The organic light emitting display device according to the present exemplary embodiment is substantially the same as the organic light emitting display device of FIG. 10 except for a pixel defining layer 1310, and thus same reference numerals are used for same elements and repetitive explanation will be omitted.

Referring to FIG. 14, an organic light emitting display device according to an exemplary embodiment of the inventive concept may include a light-blocking pattern 1315 integrally formed with pixel defining layer 1310.

The light-blocking pattern 1315 overlaps the metal line 1135. The light-blocking pattern 1315 may be disposed on the same layer as the pixel defining layer 1310.

The pixel defining layer 1310 may include an opaque material. For example, the pixel defining layer 1310 may include a black organic material. The pixel defining layer 1310 may include a carbon or a cobalt.

The light-blocking pattern 1315 may be formed from the same material as pixel defining layer 1310, which may include an opaque material. For example, the light-blocking pattern 1315 may include a black organic material. The light-blocking pattern 1315 may include a carbon or a cobalt. Therefore, the light-blocking pattern 1315 may block light due to reflection by metal wirings.

Figure 15:
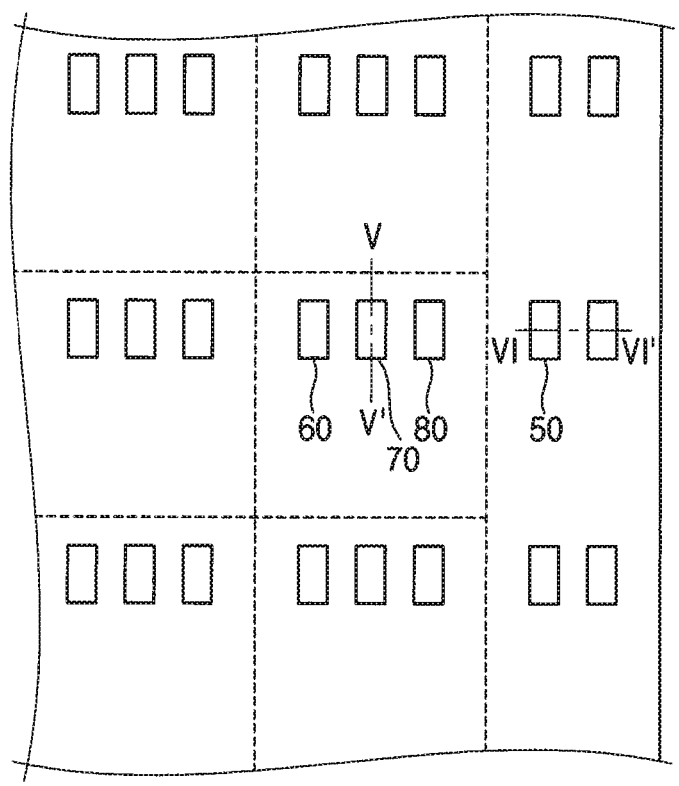
FIG. 15 is a plan view illustrating an organic light emitting display device according to an exemplary embodiment of the inventive concept.
Figure 16B:
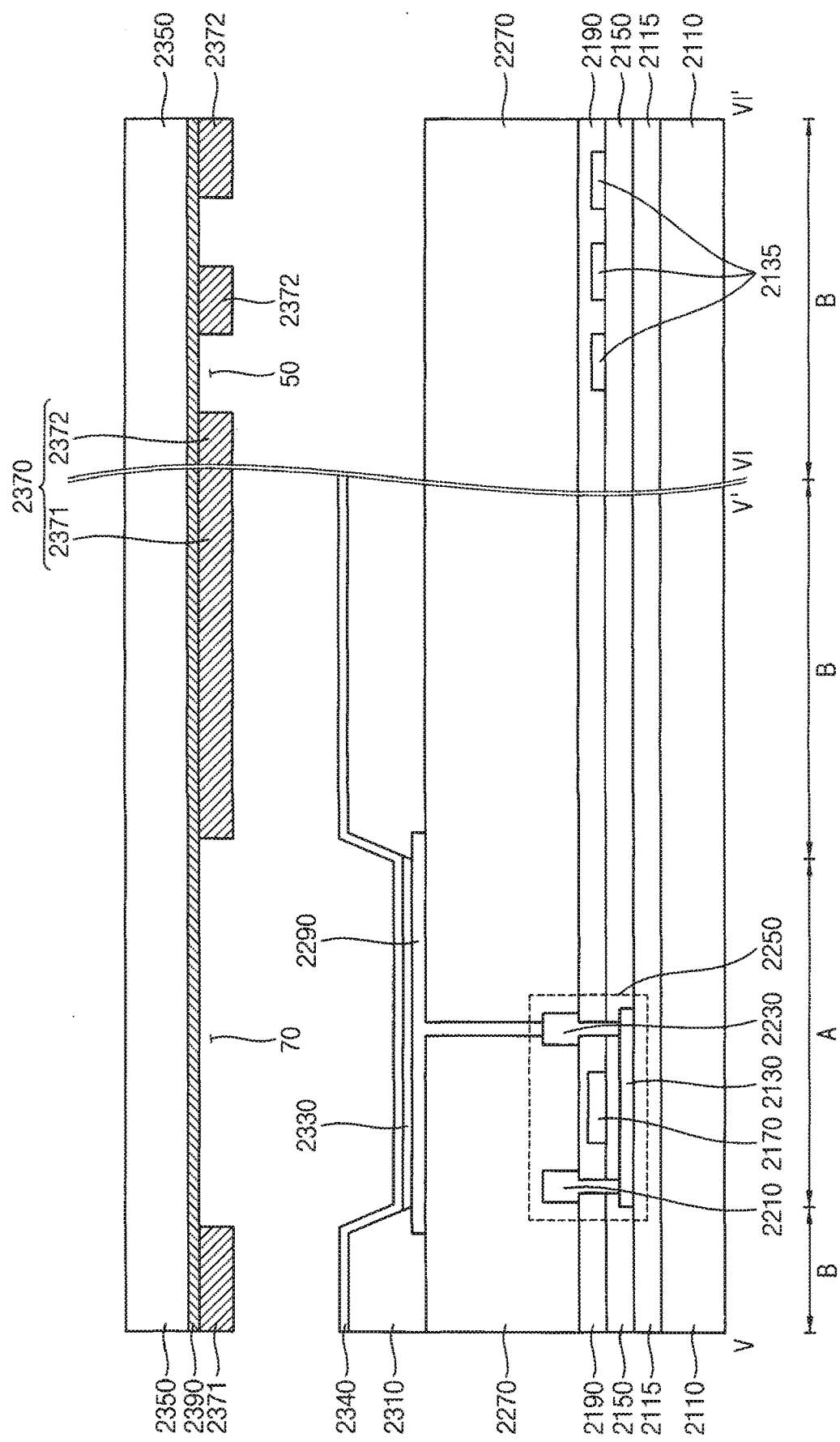
Figure 16C:
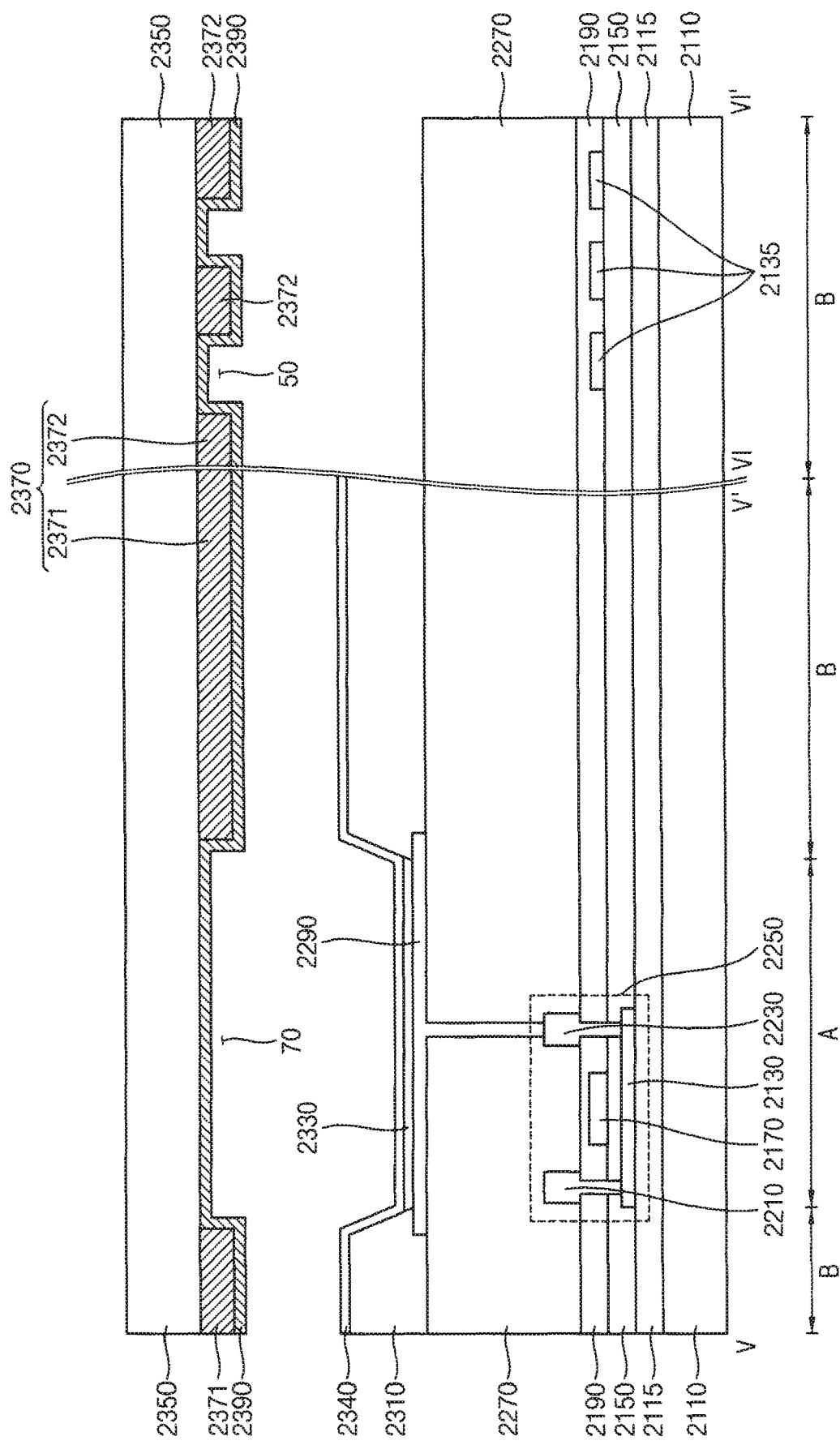

FIG. 15 is a plan view illustrating an organic light emitting display device according to an exemplary embodiment of the inventive concept. FIGS. 16A, 16B and 16C are cross-sectional views taken along the line V-V' and the line VI-VI' of FIG. 15.

The organic light emitting display device according to the present exemplary embodiment is substantially the same as the organic light emitting display device of FIGS. 1 and 2, except for a first reflective member 2370 and a second reflective member 2390. Thus, same reference numerals are used for same elements and repetitive explanation will be omitted.

Referring to FIGS. 15, 16A, 16B and 16C, an organic light emitting display device according to an exemplary embodiment of the inventive concept may include a first reflective member 2370 and a second reflective member 2390.

A reflective member device according to an exemplary embodiment of the inventive concept includes a first reflective member 2370 disposed in the reflection region B, and a second reflective member 2390 disposed in the light-emitting region A and the reflection region B.

A reflectivity of the first reflective member 2370 may be different from a reflectivity of the second reflective member 2390. A thickness of the second reflective member 2390 may be thinner than a thickness of the first reflective member 2370. A portion of light may penetrate through the second reflective member 2390 and a portion of light may be reflected by the second reflective member 2390. When the reflection member includes only the first reflective member 2370, scattered reflection may occur at an edge of the first reflective member 2370. However, an organic light emitting display device according to an exemplary embodiment of the inventive concept includes the second reflective member 2390 disposed in the light-emitting region A and the reflection region B. Thus, scattered reflection from edges of the first reflection member may be decreased.

In an exemplary embodiment of FIG. 16A, the first reflective member 2370 may be disposed on a first (e.g., lower) surface of the second substrate 2350, and the second reflective member 2390 may be disposed on a second (e.g., upper) surface opposing the first surface of the second substrate 2350. In other words, the first reflective member 2370 may be disposed under the second substrate 2350, and the second reflective member 2390 may be disposed above the second substrate 2350. A fourth insulation layer 2395 may be disposed on the second reflective member 2390.

In an exemplary embodiment of FIG. 16B, both the first reflective member 2370 and the second reflective member 2390 may be disposed on the first (e.g., lower) surface of the second substrate 2350. For example, the first reflective member 2370 may be disposed under the second substrate 2350, and the second reflective member 2390 may be disposed between the second substrate 2350 and the first reflective member 2370.

In an exemplary embodiment of FIG. 16C, both the first reflective member 2370 and the second reflective member 2390 may be disposed on the first (e.g., lower) surface of the second substrate 2350. For example, the second reflective member 2390 may be disposed under the second substrate 2350, and the first reflective member 2370 may be disposed between the second substrate 2350 and the second reflective member 2390.

Figure 17:
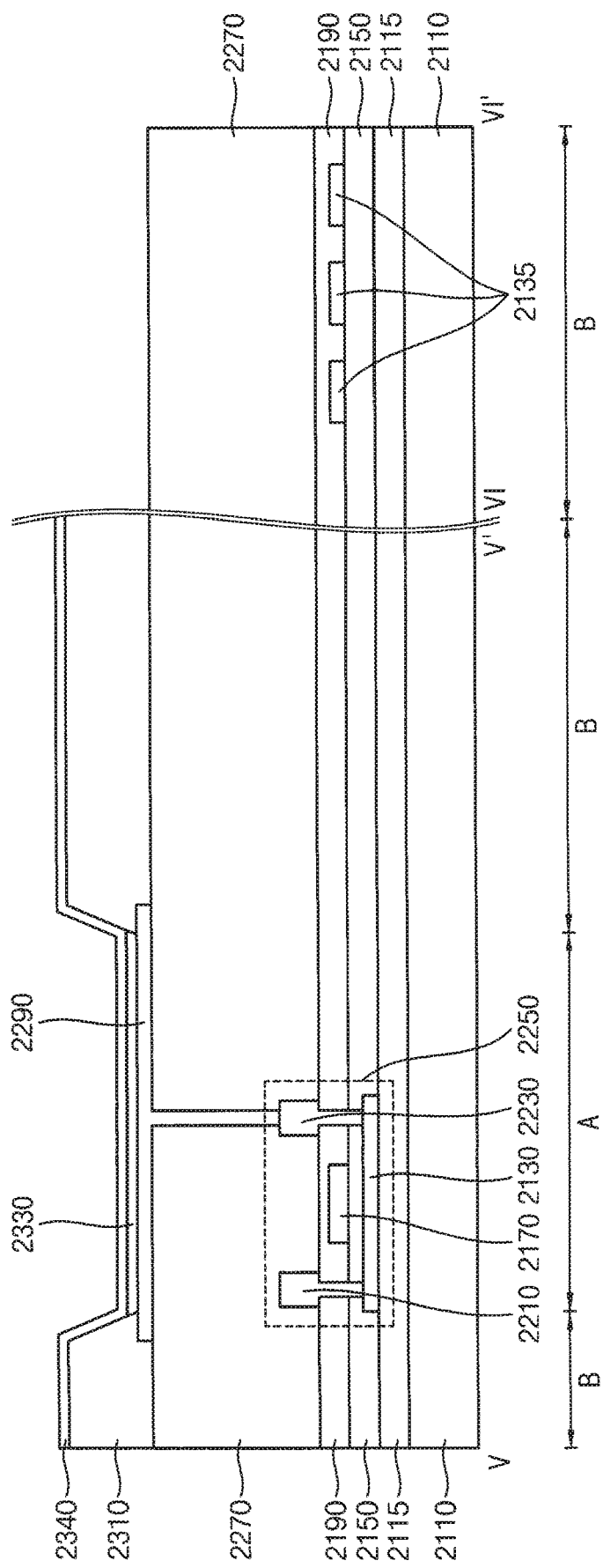
FIG. 17, FIG. 18 and FIG. 19 are cross-sectional views illustrating a method of manufacturing the organic light emitting display device of FIG. 16A.
Figure 18:
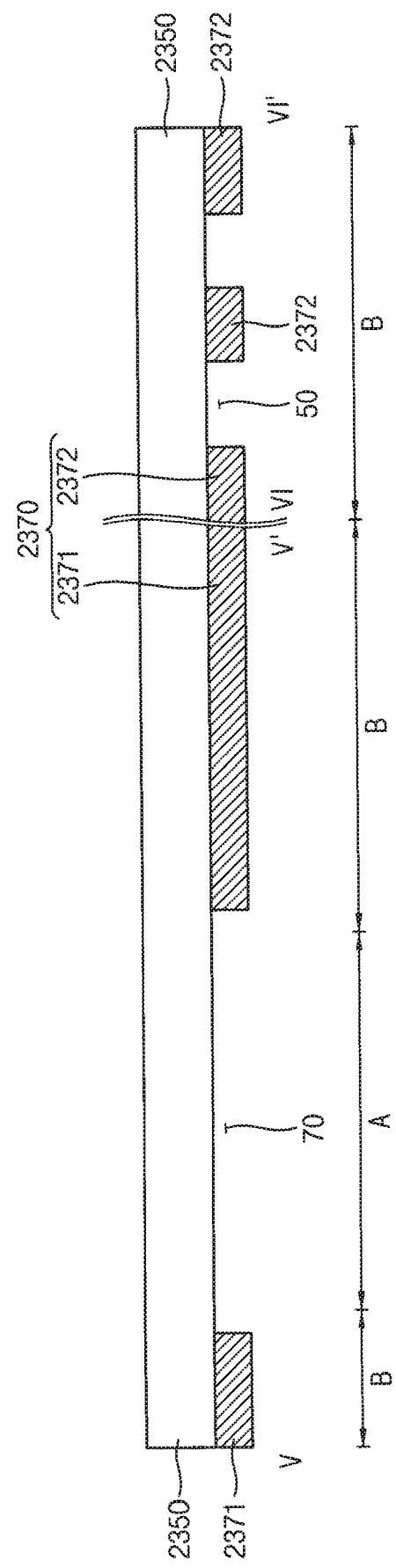
Figure 19:
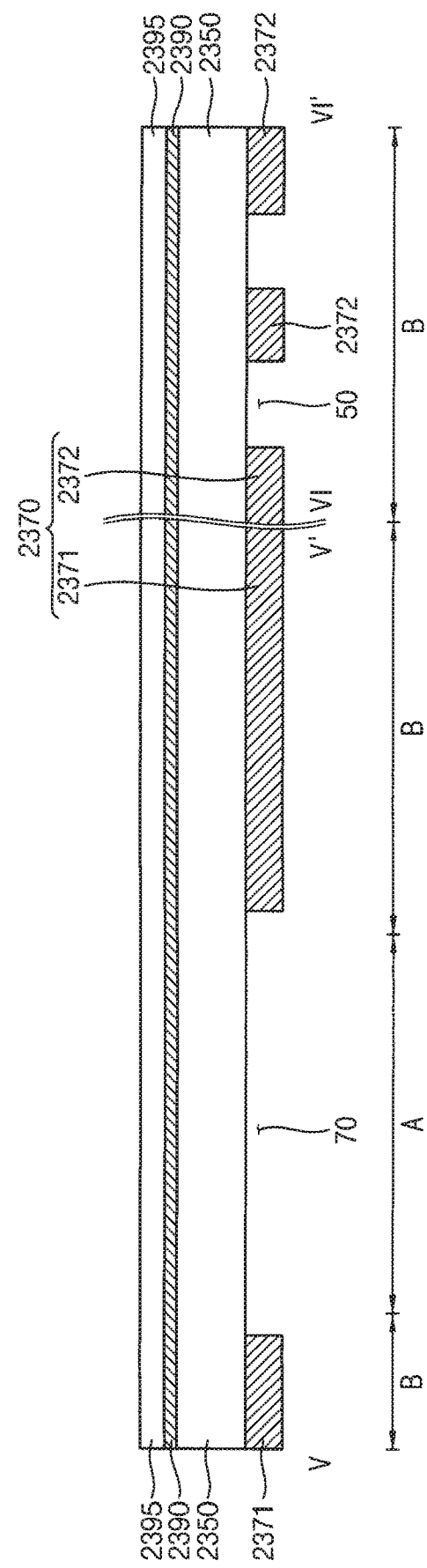

FIGS. 17 to 19 are cross-sectional views illustrating a method of manufacturing the organic light emitting display device of FIG. 16A.

Referring to FIG. 17, the pixel defining layer 2310, the light emitting layer 2330 and the second electrode 2340 are formed on the first substrate 2110 on which the first electrode 2290 is formed.

The method of manufacturing an organic light emitting display device according to the present exemplary embodiment is substantially the same as the method of manufacturing an organic light emitting display device of FIGS. 3 to 7, and thus same reference numerals are used for same elements and repetitive explanation will be omitted.

Referring to FIG. 18, the first reflective member 2370 is formed on a first surface of the second substrate 2350.

The second substrate 2350 and the first substrate 2110 may include substantially the same materials. For example, the second substrate 2350 may be formed of quartz, synthetic quartz, calcium fluoride, fluoride-doped quartz, soda lime glass, non-alkali glass etc.

The first reflective member 2370 may include a first reflective portion 2371 disposed in the display area DA, and a second reflective portion 2372 disposed in the peripheral area PA. The first reflective portion 2371 may be integrally formed with the second reflective portion 2372.

Referring to FIG. 19, the second reflective member 2390 is formed on a second (upper) surface opposing the first (lower) surface of the second substrate 2350. The fourth insulation layer 2395 is formed on the second reflective member 2390.

The second reflective member 2390 is formed directly on the second surface opposing the first surface of the second substrate 2350. The second reflective member 2390 is disposed in the light-emitting region A and the reflection region B. However, the present inventive concept is not limited thereto, and an insulation layer may instead be disposed between the second substrate 2350 and the second reflective member 2390, for example.

Figure 21:
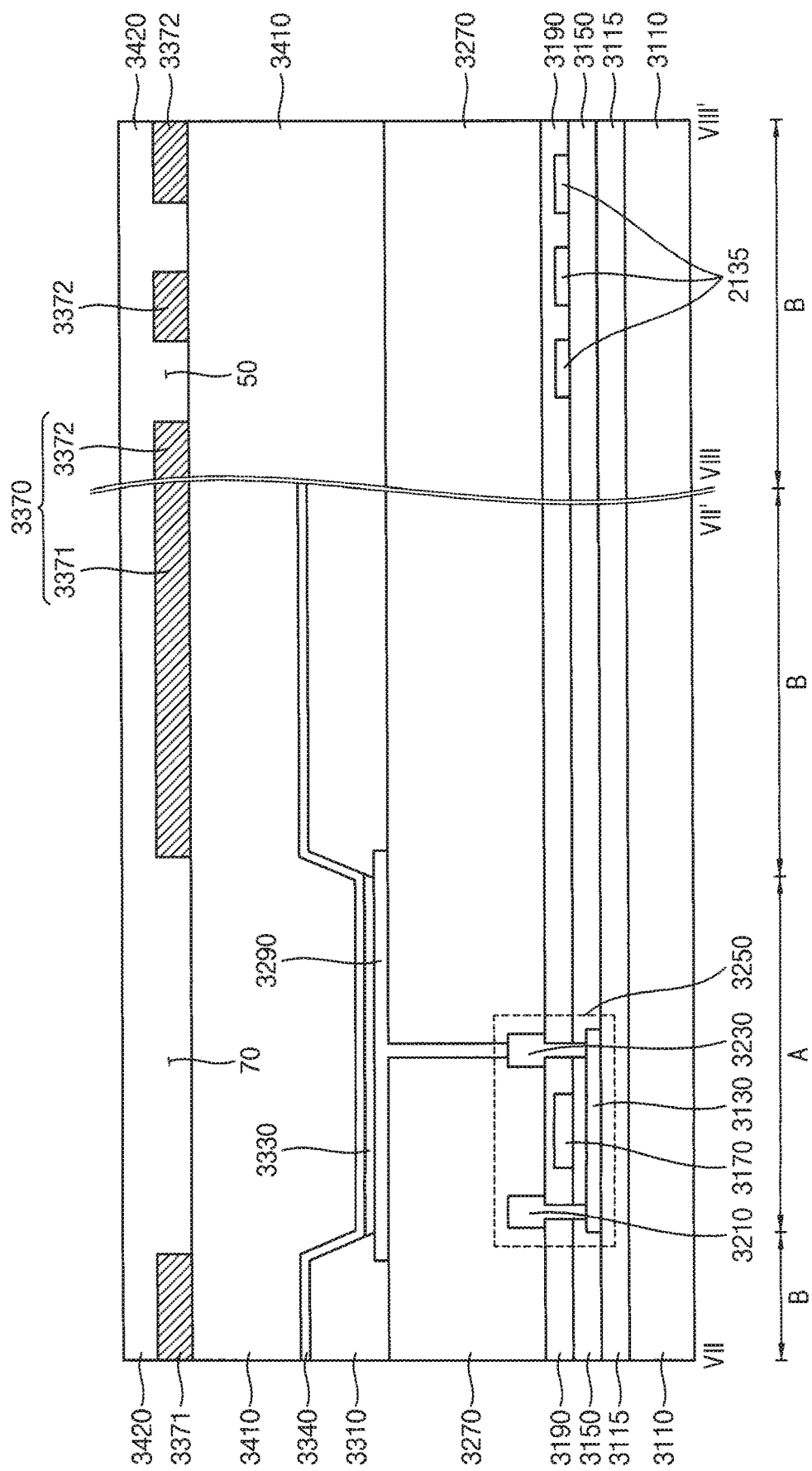
FIG. 21 is a cross-sectional view taken along the line VII-VII' and the line VIII-VIII' of FIG. 20.

FIG. 20 is a plan view illustrating an organic light emitting display device according to an exemplary embodiment of the inventive concept. FIG. 21 is a cross-sectional view taken along the line VII-VII' and the line VIII-VIII' of FIG. 20.

The organic light emitting display device according to the present exemplary embodiment is substantially the same as the organic light emitting display device of FIGS. 1 and 2, except for a thin film encapsulation layer 3410 and a fourth insulation layer 3420. Thus, some same reference numerals are used for some same elements and repetitive explanation will be omitted. A metal line 2135 may be the same as a metal line 135.

Referring to FIGS. 20 and 21, an organic light emitting display device according to an exemplary embodiment of the inventive concept may include the thin film encapsulation layer 3410 formed on a second electrode 3340, and the fourth insulation layer 3420 formed on a reflective member 3370.

The thin film encapsulation layer 3410 may include at least one inorganic layer and at least one organic layer. For example, the thin film encapsulation layer 3410 may be formed by stacking (e.g., sequentially stacking) a first inorganic layer, an organic layer, and a second inorganic layer.

For example, the organic layer may be formed of a polymer, and may itself be a single layer or multiple layers (e.g., stacked layers) that is formed of, for example, one of polyethylene terephthalate, a polyimide, a polycarbonate, an epoxy, a polyethylene and a polyacrylate. The organic layer may also be formed of a polyacrylate; for example, the organic layer may include a polymerized monomer composition including a diacrylate monomer or a triacrylate monomer. The monomer composition may further include a monoacrylate monomer. The monomer composition may further include a suitable photoinitiator such as thermoplastic polyolefin (TPO), but is not limited thereto.

The first inorganic layer and the second inorganic layer may be single layers or stacked layers including a metal oxide or a metal nitride. For example, the first inorganic layer and the second inorganic layer may include one of silicon nitride (e.g., SiNx), aluminum oxide (e.g., Al2O3), silicon oxide (e.g., SiO2), and titanium oxide (e.g., TiO2). In this case, the second inorganic layer may be formed to or configured to prevent or reduce moisture from permeating into the light-emitting structure.

However, the present inventive concept is not limited thereto, and other configurations are contemplated. For example, the thin film encapsulation layer 3410 may be formed by stacking (e.g., sequentially stacking) a first inorganic layer, a first organic layer, a second inorganic layer, a second organic layer and a third inorganic layer.

The reflective member 3370 is formed on the thin film encapsulation layer 3410.

The reflective member 3370 may include a first reflective portion 3371 disposed in the display area DA, and a second reflective portion 3372 disposed in the peripheral area PA. The first reflective portion 3371 may be integrally formed with the second reflective portion 3372.

The reflective member 3370 may include a material having predetermined reflectivity. For example, the reflective member 3370 may include gold (Au), silver (Ag), aluminum (Al), magnesium (Mg), platinum (Pt), Nickel (Ni), titanium (Ti), etc. Alternatively, the reflective member 3370 may be formed of an alloy, metal nitride, conductive metal oxide, etc. For example, the reflective member 3370 may include an alloy containing aluminum, aluminum nitride (AlNx), an alloy containing silver, tungsten nitride (WNx), an alloy containing copper, chrome nitride (CrNx), an alloy containing molybdenum, titanium nitride (TiNx), tantalum nitride (TaNx), strontium ruthenium oxide (SRO), zinc oxide (ZnOx), stannum oxide (SnOx), indium oxide (InOx), gallium oxide (GaOx), etc.

The first reflective portion 3371 may have a plurality of first openings 60, 70 and 80. The second reflective portion 3372 may have a plurality of second openings 50 having generally the same shape as the first openings 60, 70 and 80. The first openings 60, 70 and 80 and the second openings 50 may, for example, generally have a quadrangular shape. The second openings 50 may have approximately the same shape and the same size as the first openings 60, 70 and 80. However, the present inventive concept is not limited thereto, and the second openings 50 may instead have a different shape and a different size from the first openings 60, 70 and 80.

The first reflective portion 3371 may have a plurality of first openings 60, 70 and 80. The second reflective portion 3372 may have a plurality of second openings 50. Since the second openings 50 have the same shape as the first openings 60, 70 and 80, a reflectivity of the first reflective portion 3371 may be about the same as a reflectivity of the second reflective portion 3372. However, the present inventive concept is not limited thereto, and when a reflectivity of the first reflective portion 3371 is different from the reflectivity of the second reflective portion 3372, in order to adjust the reflectivity of the second reflective portion 3372, a shape, a size and the number of the second openings 50 may be changed.

A fourth insulation layer 3420 may be disposed on the reflective member 3370. The fourth insulation layer 3420 may be formed of a silicon compound, a metal oxide, etc.

Figure 22:
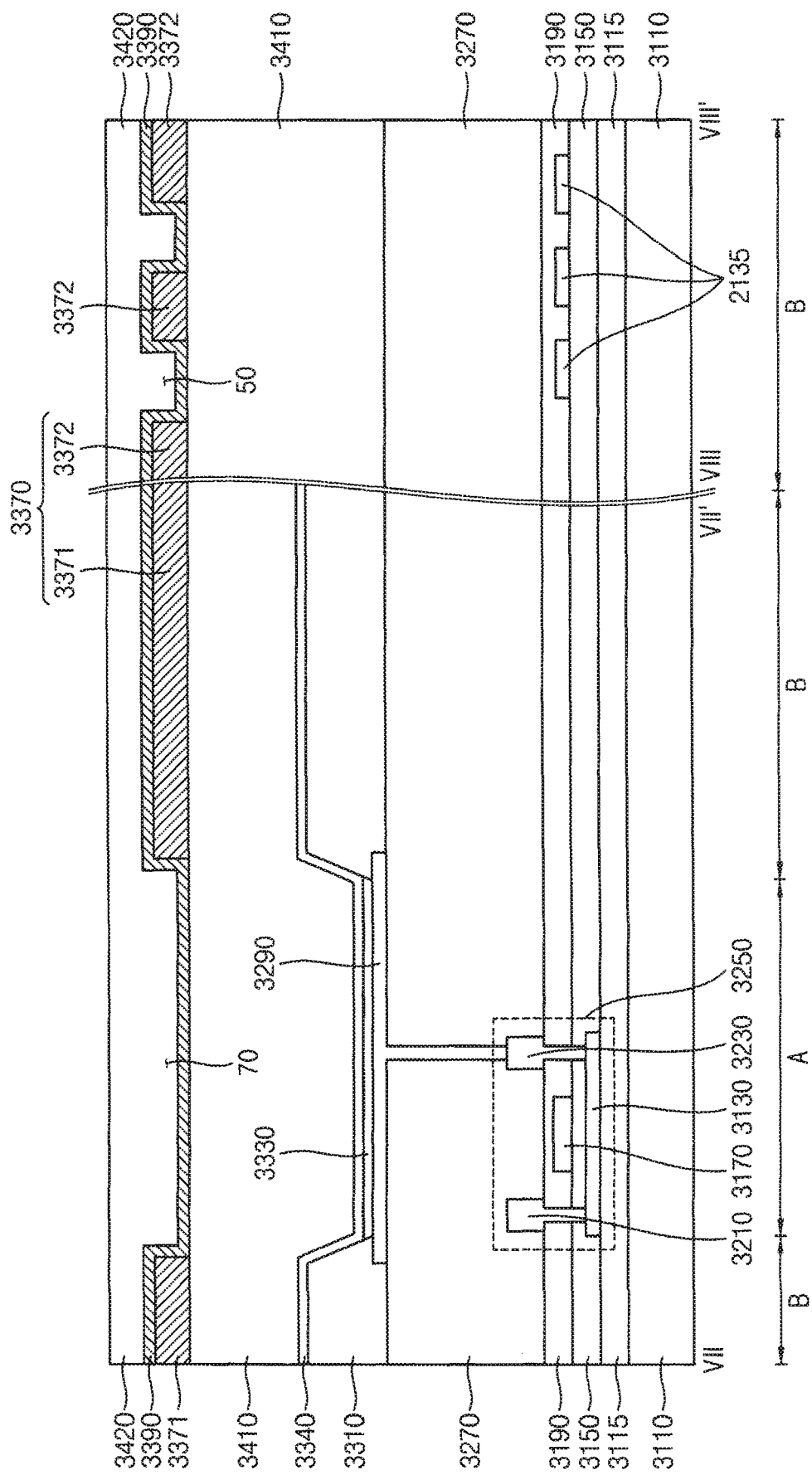
FIG. 22 is a cross-sectional view taken along the line VII-VII' and the line VIII-VIII' of FIG. 20.

FIG. 22 is a cross-sectional view taken along the line VII-VII' and the line VIII-VIII' of FIG. 20.

The organic light emitting display device according to the present exemplary embodiment is substantially the same as the organic light emitting display of FIG. 21 except for a first reflective member 3370 and a second reflective member 3390, and thus same reference numerals are used for same elements and repetitive explanation will be omitted.

Referring to FIG. 22, a reflective member according to an exemplary embodiment of the inventive concept may include a first reflective member 3370 disposed in the reflection region B, and a second reflective member 3390 disposed in the light-emitting region A and the reflection region B.

The first reflective member 3370 is formed on the thin film encapsulation layer 3410. The second reflective member 3390 is disposed on the film encapsulation layer 3410 over the first reflective member 3370.

A reflectivity of the first reflective member 3370 may be different from a reflectivity of the second reflective member 3390. A thickness of the second reflective member 3390 may be thinner than a thickness of the first reflective member 3370. A portion of light may penetrate through the second reflective member 3390 and a portion of light may be reflected by the second reflective member 3390. When the reflection member includes only the first reflective member 3370, scattered reflection may occur at an edge of the first reflective member 3370. However, an organic light emitting display device according to an exemplary embodiment of the inventive concept includes the second reflective member 3390 disposed in the light-emitting region A and the reflection region B. Thus, scattered reflection occurring at an edge of the first reflection member may be decreased.

Figure 23:
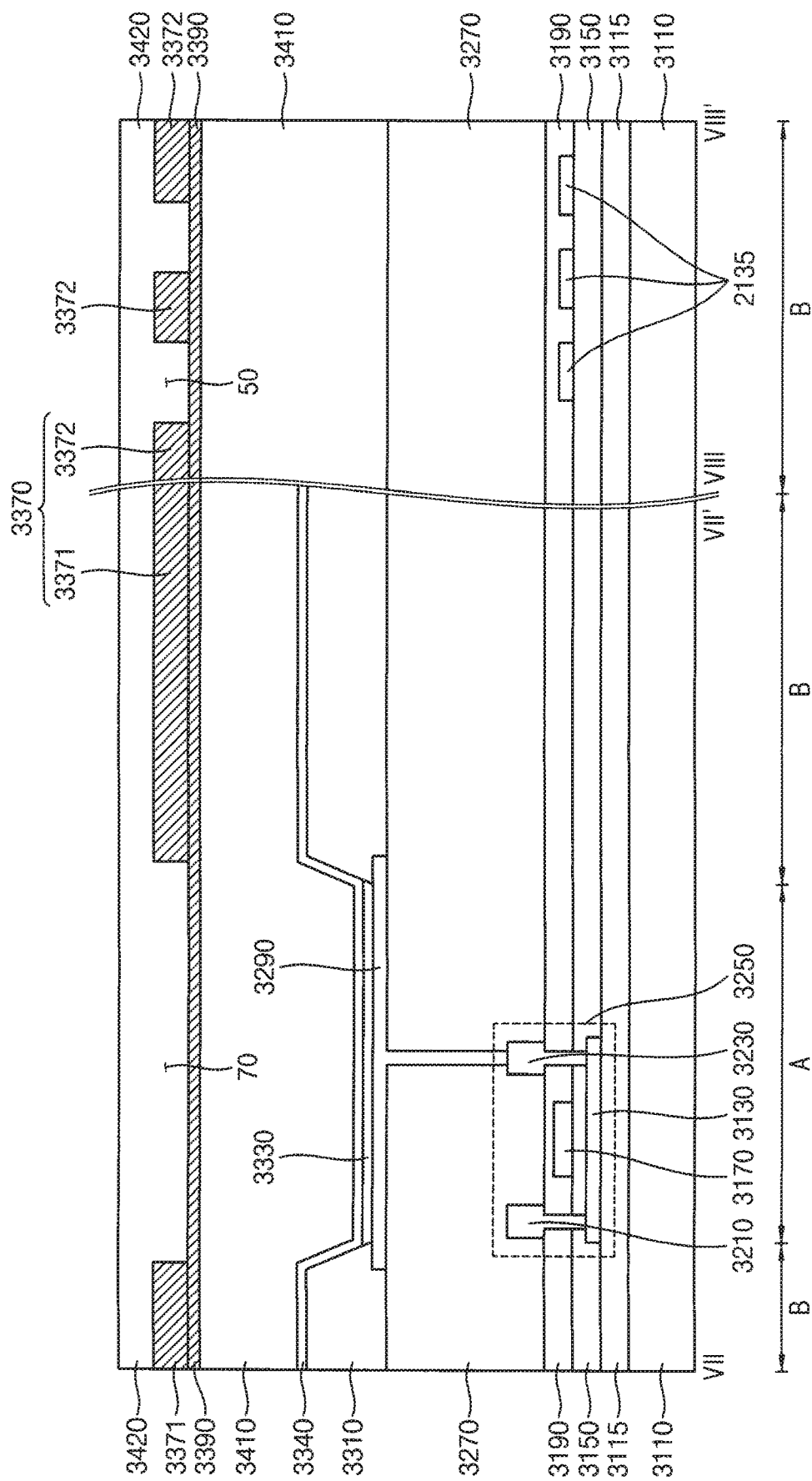
FIG. 23 is a cross-sectional view taken along the line VII-VII' and the line VIII-VIII' of FIG. 20.

FIG. 23 is a cross-sectional view taken along the line VII-VII' and the line VIII-VIII' of FIG. 20.

The organic light emitting display device according to the present exemplary embodiment is substantially the same as the organic light emitting display device of FIG. 21 except for a first reflective member 3370 and a second reflective member 3390, and thus same reference numerals are used for same elements and repetitive explanation will be omitted.

Referring to FIG. 23, a reflective member according to an exemplary embodiment of the inventive concept may include a first reflective member 3370 disposed in the reflection region B, and a second reflective member 3390 disposed in the light-emitting region A and the reflection region B.

The second reflective member 3390 is formed on the thin film encapsulation layer 3410. The first reflective member 3370 is disposed on the second reflective member 3390.

A reflectivity of the first reflective member 3370 may be different from a reflectivity of the second reflective member 3390. A thickness of the second reflective member 3390 may be thinner than a thickness of the first reflective member 3370. A portion of light may penetrate through the second reflective member 3390 and a portion of light may be reflected by the second reflective member 3390. When the reflection member includes only the first reflective member 3370, scattered reflection may occur at an edge of the first reflective member 3370. However, an organic light emitting display device according to an exemplary embodiment of the inventive concept includes the second reflective member 3390 disposed in the light-emitting region A and the reflection region B. Thus, scattered reflection occurring at an edge of the first reflection member may be decreased.

Figure 24:
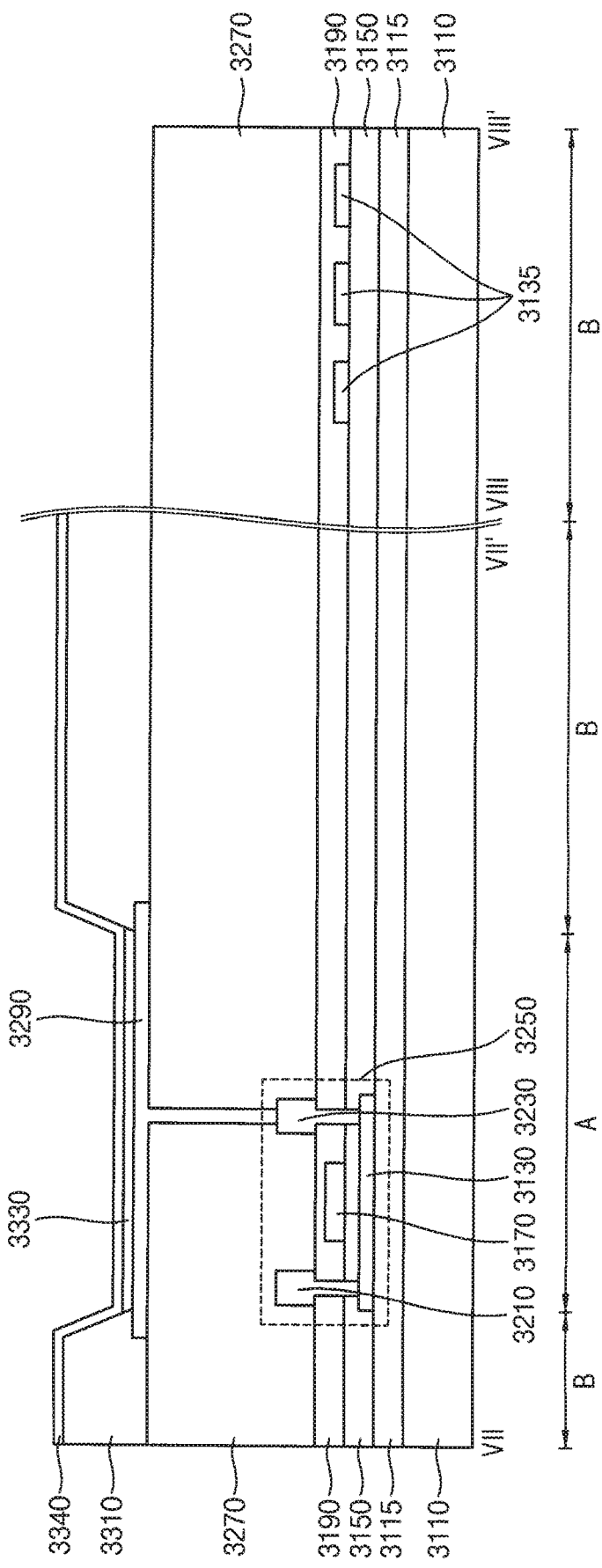
FIG. 24, FIG. 25 and FIG. 26 are cross-sectional views illustrating a method of manufacturing the organic light emitting display device of FIG. 21.
Figure 25:
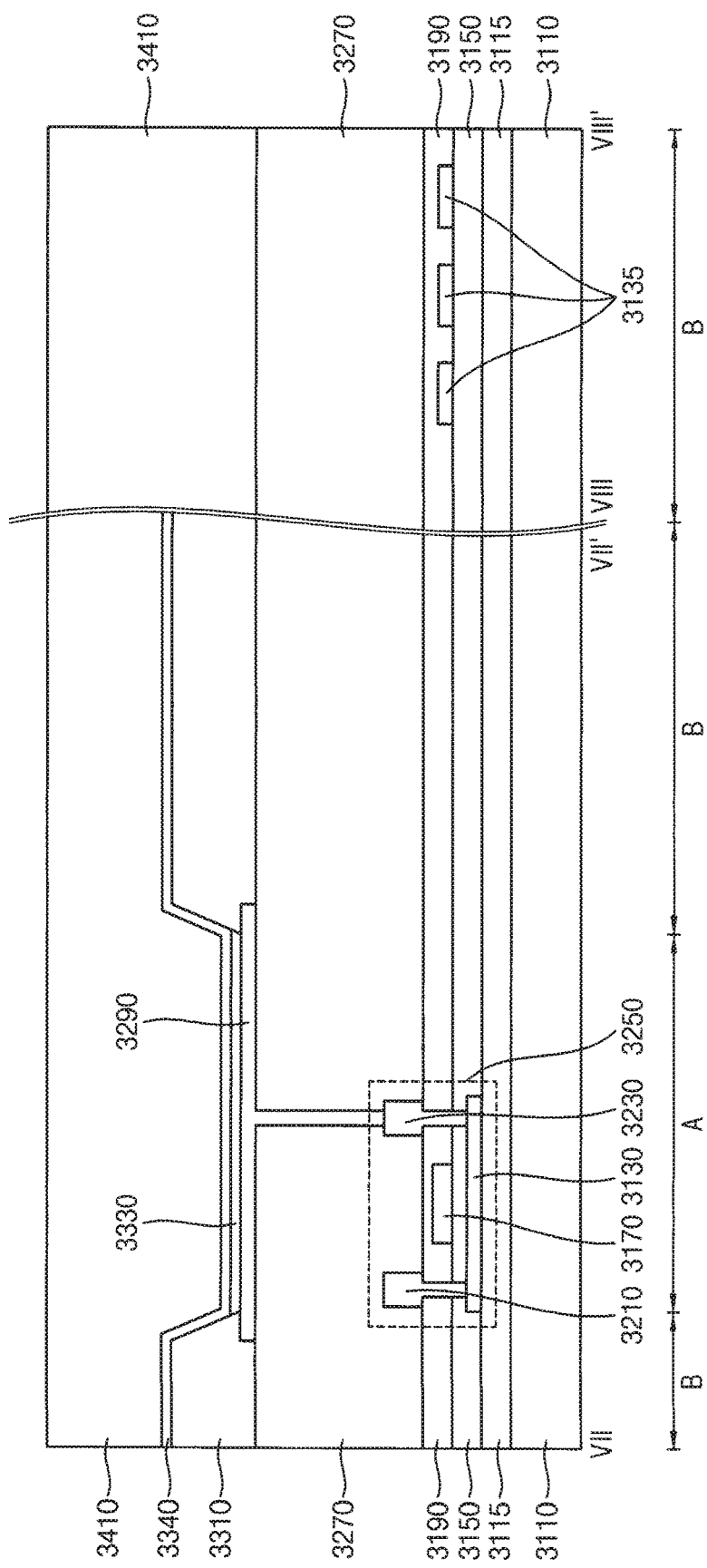
Figure 26:
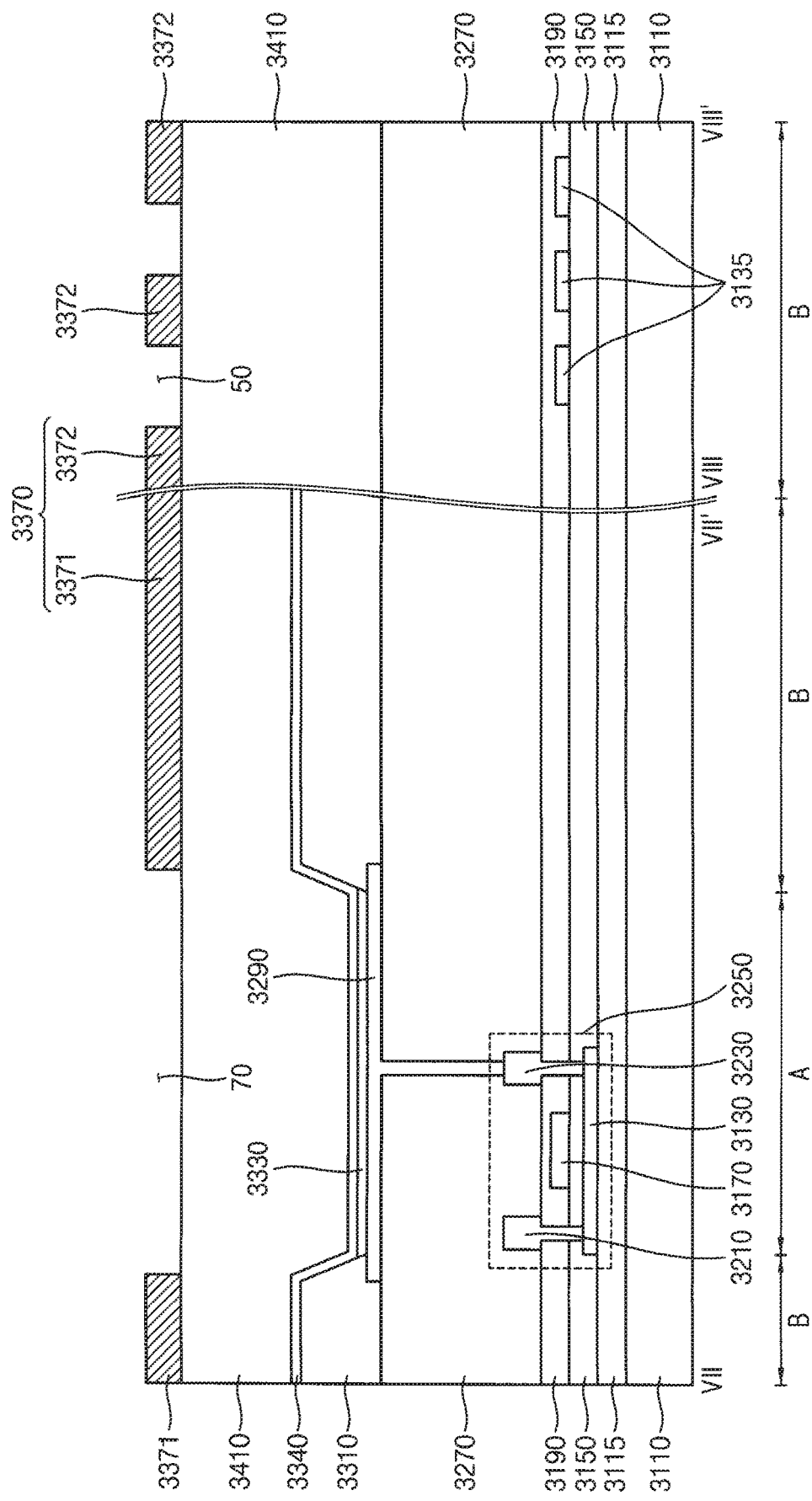

FIGS. 24 to 26 are cross-sectional views illustrating a method of manufacturing the organic light emitting display device of FIG. 21.

Referring to FIG. 24, the pixel defining layer 3310, the light emitting layer 3330 and the second electrode 3340 are formed on the first substrate 3110 on which the first electrode 3290 is formed.

The method of manufacturing an organic light emitting display device according to the present exemplary embodiment is substantially the same as the method of manufacturing an organic light emitting display device of FIGS. 3 to 7, and thus same reference numerals are used for same elements and repetitive explanation will be omitted.

Referring to FIG. 25, the thin film encapsulation layer 3410 is formed on the first substrate 3110 on which the second electrode 3340 is formed.

The thin film encapsulation layer 3410 may be formed by stacking (e.g., sequentially stacking) a first inorganic layer, an organic layer, and a second inorganic layer.

For example, the organic layer may be formed of a polymer, and may also be a single layer or multiple layers (e.g., stacked layers) that is formed of, e.g., one of polyethylene terephthalate, a polyimide, a polycarbonate, an epoxy, a polyethylene and a polyacrylate. The organic layer may also be formed of a polyacrylate; for example, the organic layer may include a polymerized monomer composition including a diacrylate monomer or a triacrylate monomer. The monomer composition may further include a monoacrylate monomer. The monomer composition may further include a suitable photoinitiator such as thermoplastic polyolefin (TPO), but is not limited thereto.

The first inorganic layer and the second inorganic layer may be single layers or stacked layers including a metal oxide or a metal nitride. For example, the first inorganic layer and the second inorganic layer may include one of silicon nitride (e.g., SiNx), aluminum oxide (e.g., Al2O3), silicon oxide (e.g., SiO2), and titanium oxide (e.g., TiO2). In this case, the second inorganic layer may be formed to or configured to prevent or reduce moisture from permeating into the light-emitting structure.

Referring to FIG. 26, the reflective member 3370 is formed on the first substrate 3110 on which the thin film encapsulation layer 3410 is formed.

The reflective member 3370 may include a first reflective portion 3371 disposed in the display area DA and a second reflective portion 3372 disposed in the peripheral area PA. The first reflective portion 3371 may be integrally formed with the second reflective portion 3372.

Referring to FIG. 21, the fourth insulation layer 3420 is formed on the first substrate 3110 on which the reflective member 3370 is formed.

A fourth insulation layer 3420 may be disposed on the reflective member 3370. The fourth insulation layer 3420 may be formed of a silicon compound, a metal oxide, etc.

Figure 28:
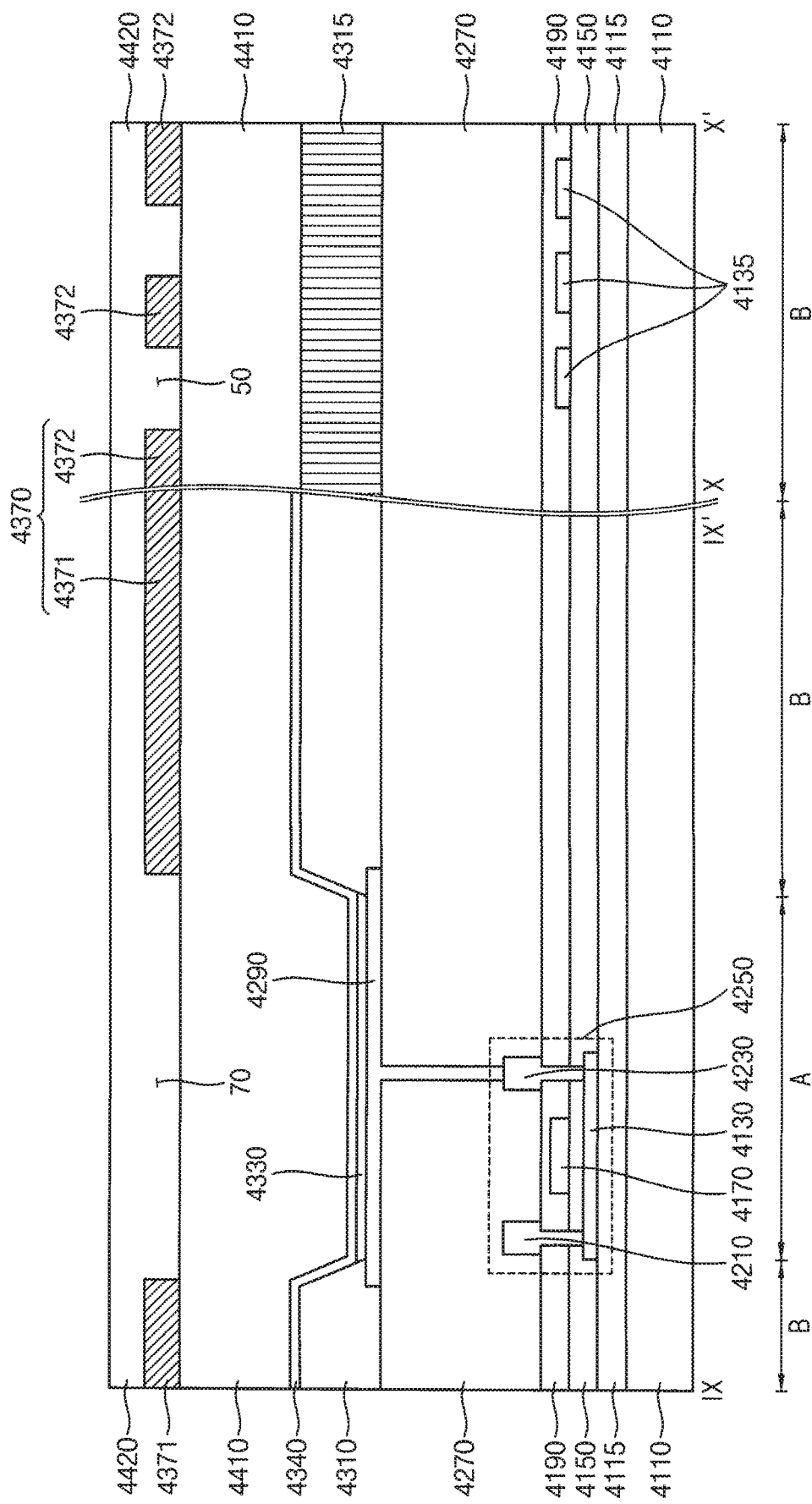
FIG. 28 is a cross-sectional view taken along the line IX-IX' and the line X-X' of FIG. 27.

FIG. 27 is a plan view illustrating an organic light emitting display device according to an exemplary embodiment of the inventive concept. FIG. 28 is a cross-sectional view taken along the line IX-IX' and the line X-X' of FIG. 27.

The organic light emitting display device according to the present exemplary embodiment is substantially the same as the organic light emitting display device of FIGS. 1 and 2 except for a light-blocking pattern 4315, a thin film encapsulation layer 4410 and a fourth insulation layer 4420, and thus same reference numerals are used for same elements and repetitive explanation will be omitted.

Referring to FIGS. 27 and 28, an organic light emitting display device according to an exemplary embodiment of the inventive concept may include the light-blocking pattern 4315, the thin film encapsulation layer 4410 formed on a second electrode 4340 and the light-blocking pattern 4315, and the fourth insulation layer 4420 formed on a reflective member 4370.

The light-blocking pattern 4315 overlaps the metal line 4135. The light-blocking pattern 4315 may be disposed on the same layer as the pixel defining layer 4310.

The light-blocking pattern 4315 may include an opaque material. For example, the light-blocking pattern 4315 may include a black organic material. The light-blocking pattern 4315 may include a carbon or a cobalt. Therefore, the light-blocking pattern 4315 may block light due to reflection by metal wirings such as the underlying metal line 4135.

The thin film encapsulation layer 4410 may be formed by stacking (e.g., sequentially stacking) a first inorganic layer, an organic layer, and a second inorganic layer.

For example, the organic layer may be formed of a polymer, and may also be a single layer or multiple layers (e.g., stacked layers) that is formed of, for example, one of polyethylene terephthalate, a polyimide, a polycarbonate, an epoxy, a polyethylene and a polyacrylate. The organic layer may also be formed of a polyacrylate; for example, the organic layer may include a polymerized monomer composition including a diacrylate monomer or a triacrylate monomer. The monomer composition may further include a monoacrylate monomer. The monomer composition may further include a suitable photoinitiator such as thermoplastic polyolefin (TPO), but is not limited thereto.

The first inorganic layer and the second inorganic layer may be single layers or stacked layers including a metal oxide or a metal nitride. For example, the first inorganic layer and the second inorganic layer may include one of silicon nitride (e.g., SiNx), aluminum oxide (e.g., Al2O3), silicon oxide (e.g., SiO2), and titanium oxide (e.g., TiO2). In this case, the second inorganic layer may be formed to or configured to prevent or reduce permeation of moisture into the light-emitting structure.

However, the present inventive concept is not limited to the above. For instance, the thin film encapsulation layer 4410 may instead be formed by stacking (e.g., sequentially stacking) a first inorganic layer, a first organic layer, a second inorganic layer, a second organic layer and a third inorganic layer.

The reflective member 4370 is formed on the thin film encapsulation layer 4410. A fourth insulation layer 4420 may be disposed on the reflective member 4370. The fourth insulation layer 4420 may be formed of a silicon compound, a metal oxide, etc.

Figure 29:
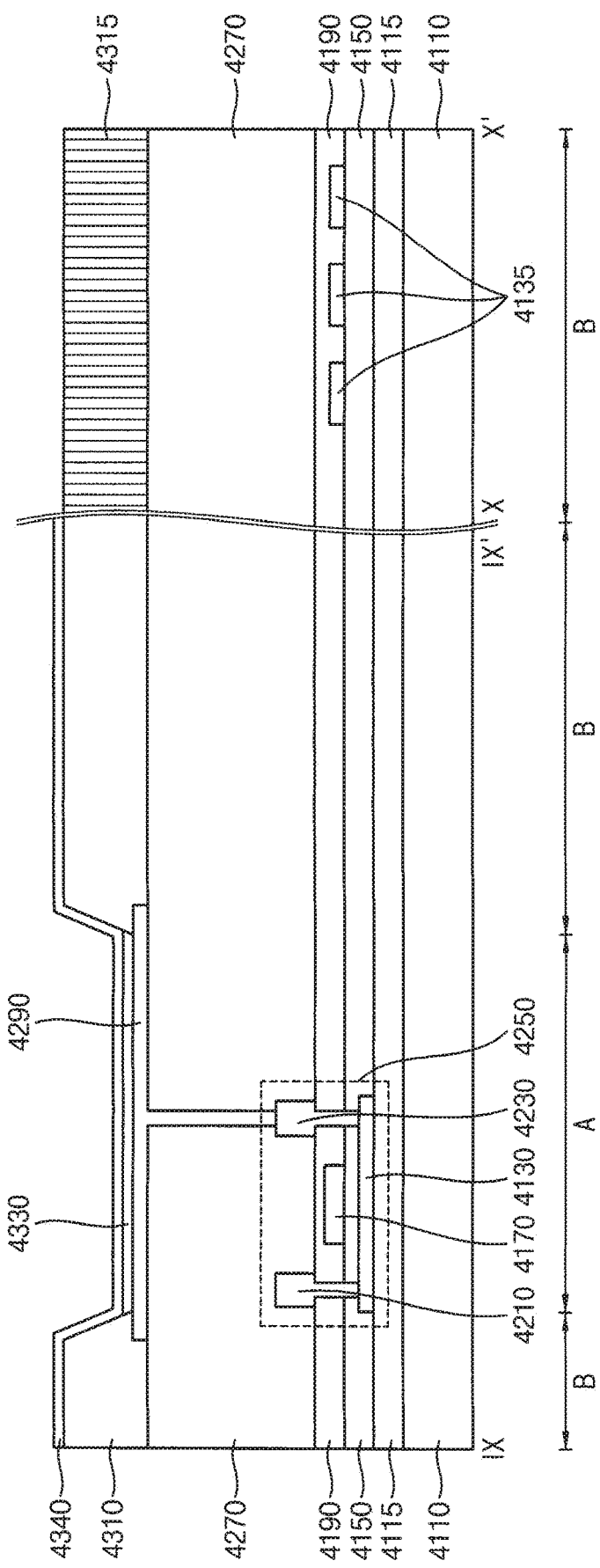
FIG. 29, FIG. 30 and FIG. 31 are cross-sectional views illustrating a method of manufacturing the organic light emitting display device of FIG. 28.
Figure 30:
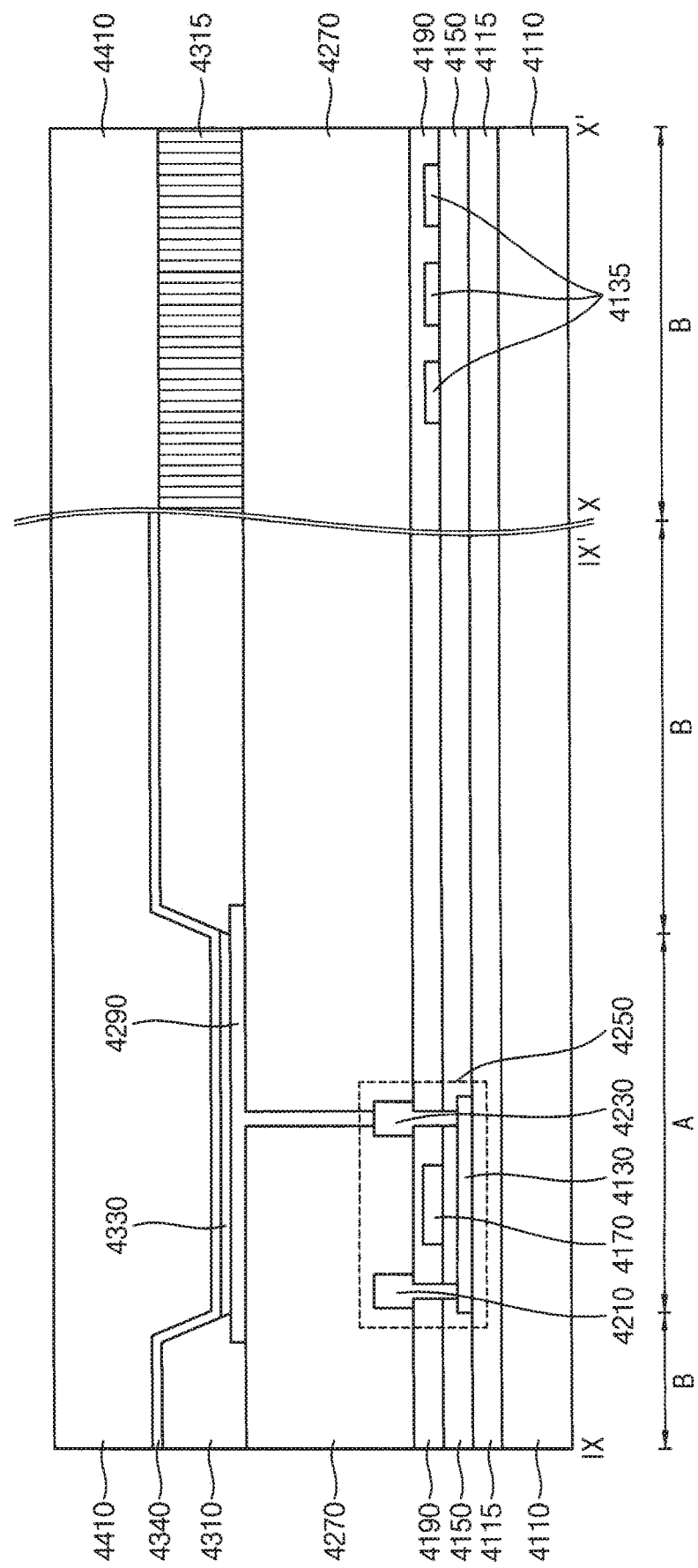
Figure 31:
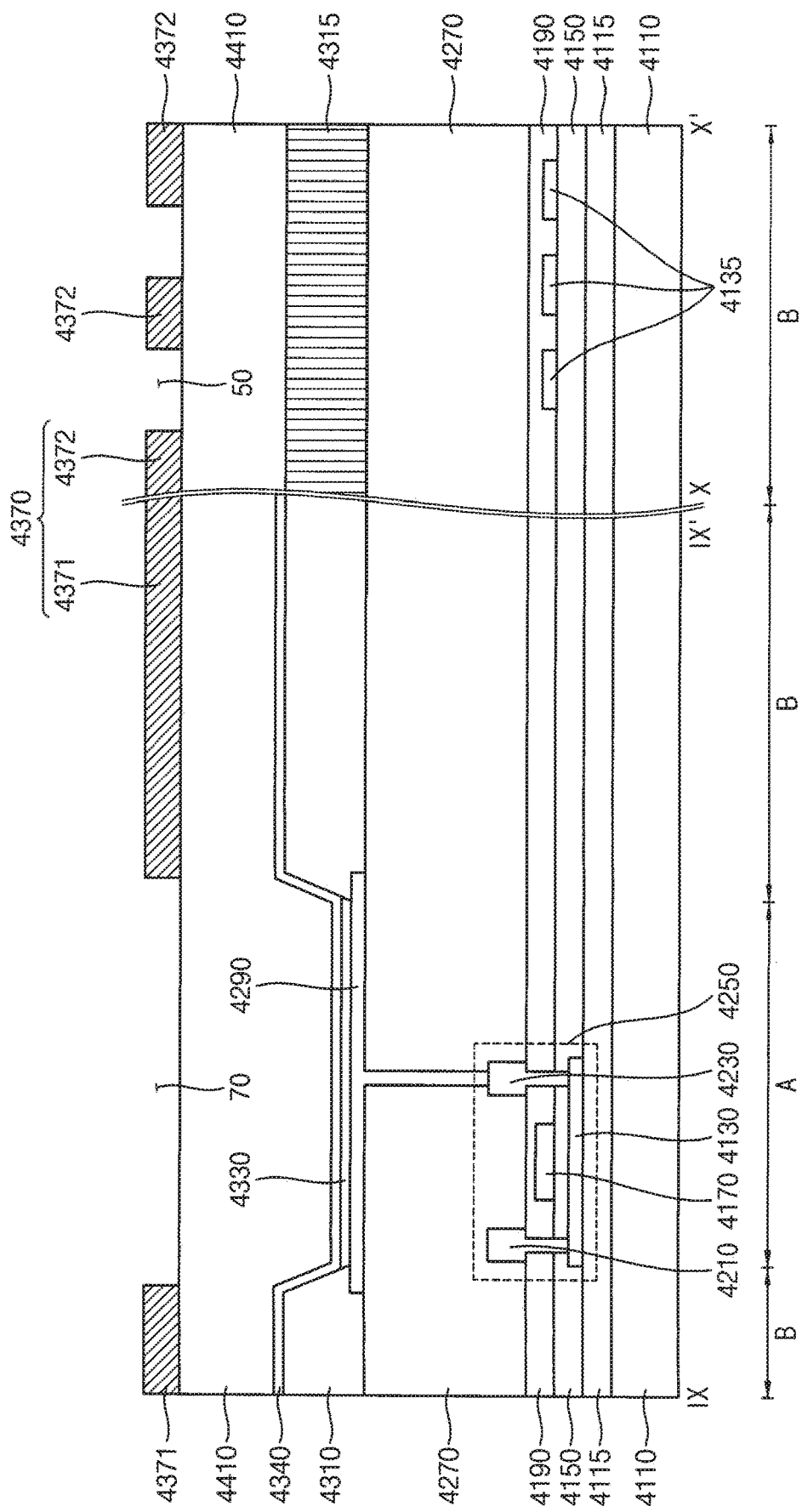

FIGS. 29 to 31 are cross-sectional views illustrating a method of manufacturing the organic light emitting display device of FIG. 28.

Referring to FIG. 29, the pixel defining layer 4310, the light-blocking pattern 4315, the light emitting layer 4330 and the second electrode 4340 are formed on the first substrate 4110 on which the first electrode 4290 is formed.

The method of manufacturing an organic light emitting display device according to the present exemplary embodiment is substantially the same as the method of manufacturing an organic light emitting display device of FIGS. 3 to 7, and thus same reference numerals are used for same elements and repetitive explanation will be omitted.

The light-blocking pattern 4315 overlaps the metal line 4135. The light-blocking pattern 4315 may be disposed on the same layer as the pixel defining layer 4310.

The light-blocking pattern 4315 may include an opaque material. For example, the light-blocking pattern 4315 may include a black organic material. The light-blocking pattern 4315 may include a carbon or a cobalt. Therefore, the light-blocking pattern 4315 may block light due to reflection by metal wirings.

Referring to FIG. 30, the thin film encapsulation layer 4410 is formed on the first substrate 4110 on which the second electrode 4340 is formed.

The thin film encapsulation layer 4410 may be formed by stacking (e.g., sequentially stacking) a first inorganic layer, an organic layer, and a second inorganic layer.

For example, the organic layer may be formed of a polymer, and may also be a single layer or multiple layers (e.g., stacked layers) that is formed of, for example, one of polyethylene terephthalate, a polyimide, a polycarbonate, an epoxy, a polyethylene and a polyacrylate. The organic layer may also be formed of a polyacrylate; for example, the organic layer may include a polymerized monomer composition including a diacrylate monomer or a triacrylate monomer. The monomer composition may further include a monoacrylate monomer. The monomer composition may further include a suitable photoinitiator such as thermoplastic polyolefin (TPO), but is not limited thereto.

The first inorganic layer and the second inorganic layer may be single layers or stacked layers including a metal oxide or a metal nitride. For example, the first inorganic layer and the second inorganic layer may include one of silicon nitride (e.g., SiNx), aluminum oxide (e.g., Al2O3), silicon oxide (e.g., SiO2), and titanium oxide (e.g., TiO2). In this case, the second inorganic layer may be formed to or configured to prevent or reduce permeation of moisture into the light-emitting structure.

Referring to FIG. 31, the reflective member 4370 is formed on the first substrate 4110 on which the thin film encapsulation layer 4410 is formed.

The reflective member 4370 may include a first reflective portion 4371 disposed in the display area DA and a second reflective portion 4372 disposed in the peripheral area PA. The first reflective portion 4371 may be integrally formed with the second reflective portion 4372.

Referring to FIG. 28, the fourth insulation layer 4420 is formed on the first substrate 4110 on which the reflective member 4370 is formed.

The fourth insulation layer 4420 may be disposed on the reflective member 4370. The fourth insulation layer 4420 may be formed of a silicon compound, a metal oxide, etc.

Figure 33:
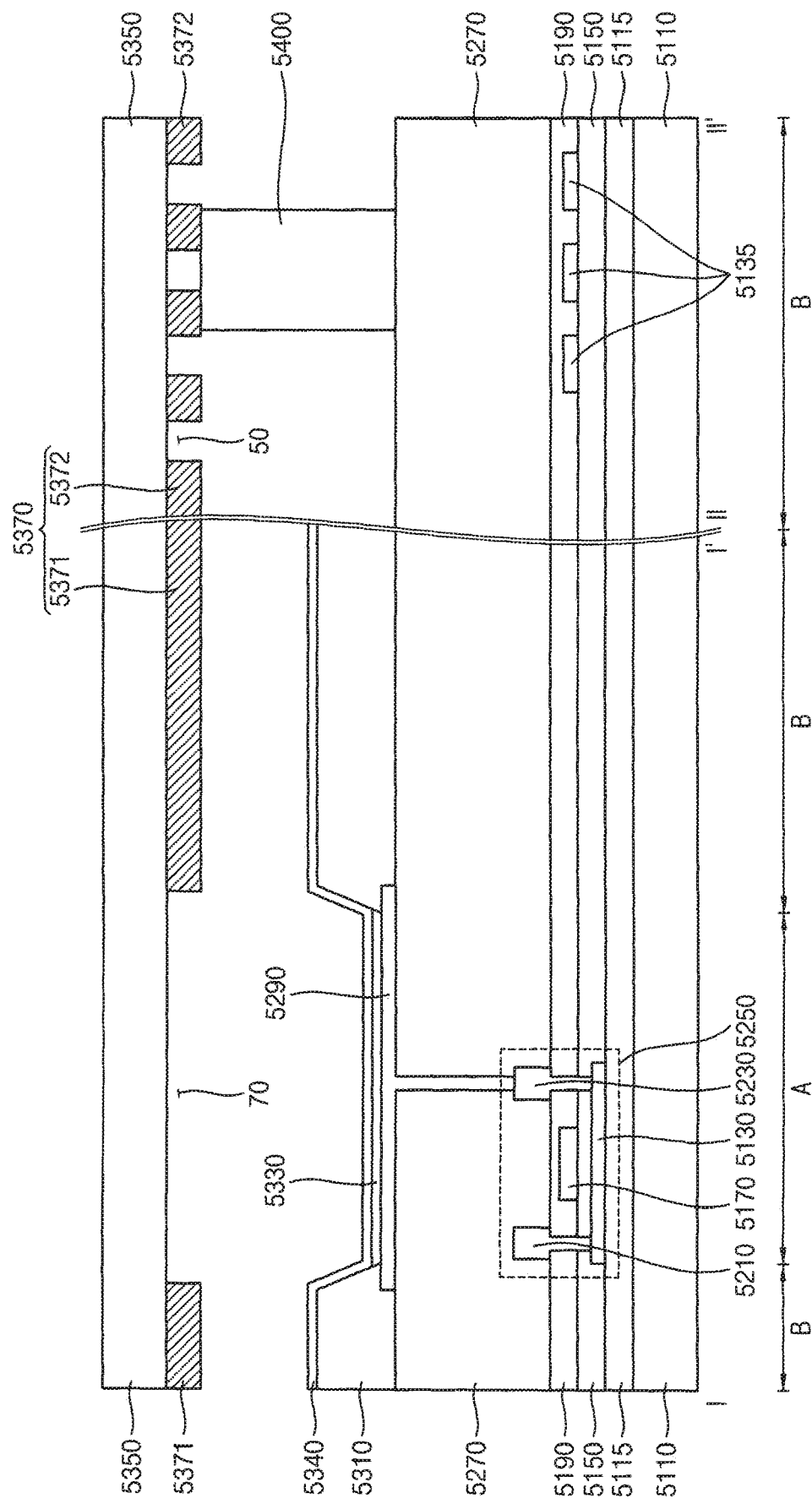
FIG. 33 is a cross-sectional view taken along the line XI-XI' and the line XII-XII' of FIG. 27.

FIG. 32 is a plan view illustrating an organic light emitting display device according to an exemplary embodiment of the inventive concept. FIG. 33 is a cross-sectional view taken along the line XI-XI' and the line XII-XII' of FIG. 27.

The organic light emitting display device according to the present exemplary embodiment is substantially the same as the organic light emitting display device of FIGS. 1 and 2 except for second openings 50 and a sealing member 5400, and thus same reference numerals are used for same elements and repetitive explanation will be omitted.

Referring to FIGS. 32 and 33, an organic light emitting display device according to an exemplary embodiment of the inventive concept may include a sealing member 5400 coupling a first substrate 5110 and a second substrate 5350 together.

The sealing member 5400 is disposed in the peripheral area PA between the first substrate 5110 and the second substrate 5350. The sealing member 5400 may encapsulate the display area DA.

The second openings 50 may be formed in the peripheral area PA. For example, the second openings 50 may be formed in an area between the sealing member 5400 and the display area DA, and an area between the sealing member 5400 and ends of the first and second substrates 5110 and 5350. For example, the second openings 50 may overlap the sealing member 5400.

According to exemplary embodiments, an organic light emitting display device includes a reflective member including a first reflective portion disposed in the display area and a second reflective portion disposed in the peripheral area. In addition, the second reflective portion has openings having generally the same shape as openings formed in the first reflective portion. Thus, a reflectivity of the first reflective portion may be the same as a reflectivity of the second reflective portion, and thus the first reflective portion and the second reflective portion may appear to the viewer as an integral reflective member. Therefore, a bezel-less mirror organic light emitting display device may be manufactured.

In addition, an organic light emitting display device includes a light-blocking pattern disposed in the peripheral area and overlapping metal lines, and thus the light-blocking pattern may block light due to reflection of the metal lines. Since light from a lower substrate is blocked, a reflectivity of the reflective member may be constant. Thus, a reflectivity of the second reflective portion may be adjusted by adjusting of a shape, a size and the number of the second openings. The reflectivity of the second reflective portion may be substantially the same as a reflectivity of the first reflective portion.

In addition, an organic light emitting display device includes a thin film encapsulation layer. Thus, a flexible organic light emitting display device having mirror function and touch function may be manufactured.

The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein. Various features of the above described and other embodiments can be mixed and matched in any manner, to produce further embodiments consistent with the invention.

What is claimed is:

1. An organic light emitting display device comprising:
   a substrate comprising a display area and a peripheral area neighboring each other in a first direction;
   a first electrode overlapping the display area;
   a second electrode wider than the first electrode in the first direction and overlapping the first electrode;
   a light emitting layer disposed between the first electrode and the second electrode;
   a first reflective member overlapping both the display area and the peripheral area, comprising a first opening positioned over the display area, comprising a second opening positioned over the peripheral area, and including a metal, an alloy, metal nitride, or conductive metal oxide that has predetermined reflectivity;
   a second reflective member at least partially positioned inside the second opening, wherein a reflectivity of the second reflective member is unequal to a reflectivity of the first reflective member; and
   an encapsulation layer disposed between the second electrode and the second reflective member and directly contacting each of a face of the first reflective member and a face of the second reflective member,
   wherein the face of the first reflective member is coplanar with the face of the second reflective member and is wider than the face of the second reflective member in the first direction, wherein the first reflective member comprises:
   a first reflective portion having the first opening and overlapping the display area; and
   a second reflective portion having the second opening and overlapping the peripheral area,
   wherein the second reflective portion is integrally formed with the first reflective portion,
   wherein a reflectivity of the second reflective portion is substantially equal to a reflectivity of the first reflective portion, and wherein the second opening has substantially the same shape and the same size as the first opening.

2. The organic light emitting display device of claim 1, wherein a recess structure of the second reflective member is positioned inside the second opening, and wherein the face of the second reflective member is a face of the recess structure of the second reflective member.

3. The organic light emitting display device of claim 2, further comprising:
   a switching element electrically connected to the first electrode and comprising a gate electrode, a source electrode, and a drain electrode;
   a pixel defining layer proximate to the first electrode and having an opening that accommodates the light-emitting layer; and
   a metal line disposed in the peripheral area.

4. The organic light emitting display device of claim 1, further comprising: a metal line overlapping the peripheral area,
   wherein a portion of the second reflective member overlaps the metal line and is positioned inside the second opening, and wherein the first reflective member contains a metal.

5. The organic light emitting display device of claim 4, wherein the second reflective portion overlaps the metal line.

6. The organic light emitting display device of claim 4, further comprising:
   a switching element electrically connected to the first electrode and comprising a gate electrode, a source electrode, and a drain electrode;
   a pixel defining layer proximate to the first electrode and having an opening that accommodates a light-emitting layer,
   wherein a material of the metal line is identical to a material of the gate electrode.

7. The organic light emitting display device of claim 1, wherein the first reflective member is positioned between the encapsulation layer and the second reflective member,
   wherein the second opening is a through hole, and wherein the second reflective member partially fills the through hole without completely filling the through hole.

8. An organic light emitting display device comprising:
a substrate comprising a display area and a peripheral area neighboring each other in a first direction;
a first electrode overlapping the display area;
a second electrode wider than the first electrode in the first direction and overlapping the first electrode;
a light emitting layer disposed between the first electrode and the second electrode;
a first reflective member overlapping both the display area and the peripheral area, comprising a first opening positioned over the display area, comprising a second opening positioned over the peripheral area, and including a metal, an alloy, metal nitride, or conductive metal oxide that has predetermined reflectivity;
a second reflective member at least partially positioned inside the second opening, wherein a reflectivity of the second reflective member is unequal to a reflectivity of the first reflective member; and
an insulation layer,
wherein the first reflective member is positioned between the insulation layer and the substrate,
wherein the second reflective member is positioned between the insulation layer and the first reflective member and includes a recess structure positioned inside the second opening, and
wherein the insulation layer includes a first portion overlapping the first opening and a second portion overlapping a portion of the first reflective member positioned over the display area, and wherein the first portion of the insulation layer is narrower than the second portion of the insulation layer, wherein the first reflective member comprises:
a first reflective portion having the first opening and overlapping the display area; and
a second reflective portion having the second opening and overlapping the peripheral area,
wherein the second reflective portion is integrally formed with the first reflective portion,
wherein a reflectivity of the second reflective portion is substantially equal to a reflectivity of the first reflective portion, and wherein the second opening has substantially the same shape and the same size as the first opening.

9. The organic light emitting display device of claim 8, wherein a second portion of the insulation layer is positioned inside the first opening, and wherein a thickness of the second portion of the insulation layer is equal to a thickness of the first portion of the insulation layer.

10. The organic light emitting display device of claim 8, further comprising a metal line, wherein the first potion of the insulation layer overlaps the metal line and overlaps no light emitting layer of the organic light emitting display device in a direction perpendicular to the substrate, and wherein a section of the second reflective member is positioned outside the second opening and is positioned between the insulation layer and the first reflective member in the direction perpendicular to the substrate.

* * * * *